(12) United States Patent
Sandstrom

(10) Patent No.: US 8,077,377 B2
(45) Date of Patent: Dec. 13, 2011

(54) SPATIAL LIGHT MODULATOR WITH STRUCTURED MIRROR SURFACES

(75) Inventor: Torbjorn Sandstrom, Pixbo (SE)

(73) Assignee: Micronic MyData AB, Taby (SE)

( * ) Notice: Subject to any disclaimer, the term of this patent is extended or adjusted under 35 U.S.C. 154(b) by 105 days.

(21) Appl. No.: 12/430,046

(22) Filed: Apr. 24, 2009

(65) Prior Publication Data

US 2009/0303571 A1    Dec. 10, 2009

Related U.S. Application Data

(60) Provisional application No. 61/047,715, filed on Apr. 24, 2008.

(51) Int. Cl.
*G02B 26/00* (2006.01)
*G03B 27/42* (2006.01)

(52) U.S. Cl. ........ 359/291; 359/290; 359/292; 359/295; 359/298; 359/224; 250/548; 250/492.2; 355/53; 355/67; 355/77; 345/85; 345/108; 348/744; 348/770; 348/771

(58) Field of Classification Search .......... 250/548, 250/492.2; 355/53, 67, 77; 345/85, 108; 348/744, 770, 771; 359/223, 224, 279, 290–292, 359/295, 298
See application file for complete search history.

(56) References Cited

U.S. PATENT DOCUMENTS

| | | | |
|---|---|---|---|
| 4,498,010 A | 2/1985 | Biechler et al. | |
| 4,879,605 A | 11/1989 | Warkentin et al. | |
| 4,902,133 A | 2/1990 | Tojo et al. | |
| 4,989,255 A | 1/1991 | Manns et al. | |
| 5,103,101 A | 4/1992 | Berglund et al. | |
| 5,148,157 A | 9/1992 | Florence | |
| 5,278,949 A | 1/1994 | Thayer | |
| 5,340,700 A | 8/1994 | Chen et al. | |
| 5,393,987 A | 2/1995 | Abboud et al. | |
| 5,459,610 A | 10/1995 | Bloom et al. | |
| 5,467,146 A | 11/1995 | Huang et al. | |
| 5,471,305 A | 11/1995 | Yoneda et al. | |
| 5,486,851 A | 1/1996 | Gehner et al. | |

(Continued)

FOREIGN PATENT DOCUMENTS

EP    467076 A2    1/1992

(Continued)

OTHER PUBLICATIONS

Full-complex spatial filtering with a phase mostly DMD, James M. Florence and Richard D. Juday, Proc. SPIE 1558, 487 (1991), DOI:10.1117/12.49655.

(Continued)

*Primary Examiner* — Evelyn A. Lester
(74) *Attorney, Agent, or Firm* — Ernest J. Beffel, Jr.; Haynes Beffel & Wolfeld LLP

(57) ABSTRACT

The invention relates to methods to improve SLMs, in particular to reflecting micromechanical SLMs, for applications with simple system architecture, high precision, high power handling capability, high throughput, and/or high optical processing capability. Applications include optical data processing, image projection, lithography, image enhancement, holography, optical metrology, coherence and wavefront control, and adaptive optics. A particular aspect of the invention is the achromatization of diffractive SLMs so they can be used with multiple wavelengths sequentially, simultaneously or as a result of spectral broadening in very short pulses.

18 Claims, 16 Drawing Sheets

U.S. PATENT DOCUMENTS

| | | | |
|---|---|---|---|
| 5,504,504 | A | 4/1996 | Markandey et al. |
| 5,539,568 | A | 7/1996 | Lin et al. |
| 5,563,706 | A | 10/1996 | Shibuya et al. |
| 5,583,688 | A | 12/1996 | Hornbeck |
| 5,598,265 | A | 1/1997 | de Groot |
| 5,621,216 | A | 4/1997 | Clarke et al. |
| 5,774,254 | A | 6/1998 | Berlin |
| 5,835,256 | A | 11/1998 | Huibers |
| 5,870,176 | A | 2/1999 | Sweatt et al. |
| 6,103,101 | A | 8/2000 | Fragelli et al. |
| 6,118,535 | A | 9/2000 | Goldberg et al. |
| 6,142,641 | A | 11/2000 | Cohen et al. |
| 6,169,624 | B1 | 1/2001 | Godil et al. |
| 6,177,980 | B1 | 1/2001 | Johnson |
| 6,184,994 | B1 | 2/2001 | Freischlad |
| 6,201,545 | B1 | 3/2001 | Wong et al. |
| 6,261,728 | B1 | 7/2001 | Lin et al. |
| 6,285,488 | B1 | 9/2001 | Sandstrom et al. |
| 6,301,000 | B1 | 10/2001 | Johnson |
| 6,348,907 | B1 | 2/2002 | Wood |
| 6,373,619 | B1 | 4/2002 | Sandstrom |
| 6,489,984 | B1 | 12/2002 | Johnson |
| 6,501,600 | B1 | 12/2002 | Godil et al. |
| 6,504,644 | B1 * | 1/2003 | Sandstrom .............. 359/291 |
| 6,590,695 | B1 | 7/2003 | Kurtz et al. |
| 6,605,816 | B2 | 8/2003 | Sandstrom et al. |
| 6,618,185 | B2 | 9/2003 | Sandstrom |
| 6,717,097 | B1 | 4/2004 | Sandstrom et al. |
| 6,717,650 | B2 | 4/2004 | Jain |
| 6,813,062 | B2 | 11/2004 | Sandstrom |
| 6,833,854 | B1 | 12/2004 | Sandstrom et al. |
| 7,009,753 | B2 | 3/2006 | Sandstrom et al. |
| 7,110,159 | B2 | 9/2006 | Ljungblad et al. |
| 7,170,669 | B1 | 1/2007 | Jain et al. |
| 7,186,486 | B2 | 3/2007 | Walford et al. |
| 7,209,275 | B2 * | 4/2007 | Latypov et al. ........... 359/237 |
| 7,227,687 | B1 | 6/2007 | Trisnadi et al. |
| 7,502,160 | B2 | 3/2009 | Aksyuk et al. |
| 7,773,287 | B2 * | 8/2010 | Latypov et al. ........... 359/292 |
| 2001/0040670 | A1 | 11/2001 | Fielding |
| 2002/0197565 | A1 | 12/2002 | Wu |
| 2003/0107770 | A1 | 6/2003 | Klatchko et al. |
| 2004/0008397 | A1 | 1/2004 | Noonan |
| 2004/0251430 | A1 | 12/2004 | Sandstrom |
| 2005/0053850 | A1 | 3/2005 | Askebjer et al. |
| 2005/0219502 | A1 * | 10/2005 | Sandstrom et al. ........ 355/77 |
| 2008/0002155 | A1 | 1/2008 | Ishii et al. |
| 2008/0024745 | A1 * | 1/2008 | Baselmans et al. ........ 355/67 |

FOREIGN PATENT DOCUMENTS

| | | |
|---|---|---|
| EP | 477566 A2 | 4/1992 |
| EP | 0568801 | 11/1993 |
| EP | 1369743 | 12/2003 |
| WO | 9309469 A1 | 5/1993 |
| WO | 9922262 | 5/1999 |
| WO | 0049577 | 8/2000 |
| WO | 01/93303 | 12/2001 |

OTHER PUBLICATIONS

Full-complex modulation with two one-parameter SLMs, Richard D. Juday and James M. Florence, Proc. SPIE 1558, 499 (1991), DOI:10.1117/12.49656.

International Search Report of International Application No. PCT/SE2005/000269 mailed on Jul. 14, 2005.

Kalus, C.K. et al. "Benchmarking of available rigorous electromagnetic field (EMF) simulators for phase-shift mask applications," Microelectronic Engineering, Sep. 2001, vol. 57-58, pp. 79-86.

Mak, G.Y.H. et al. "Placement sensitivity to aberration in optical imaging," 2003 IEEE Conference on Electron Devices and Solid-state Circuits, Dec. 16-18, 2003, pp. 475-478.

McCarthy, A.M. et al. "A Novel Technique for Detecting Lithographic Defects." IEEE Transactions on Semiconductor Manufacturing, vol. 1, No. 1, Feb. 1998, p. 10-15.

Newman, T. et al. "Evaluation of OPC Mask Printing with a Raster Scan Pattern Generator." Proceeding of SPIE, vol. 4691, Optical Microlithography XV, Jul. 2002, p. 1320-1330.

Rieger, M.L. et al. "Lithographic Alternatives to PSM Repair." Proceedings of SPIE, vol. 1674, Optical/Laser Microlithography V, 1992, p. 609-617.

Stephanakis, A.C. et al. "Advances in 1 : 1 Optical Lithography," Proceedings of SPIE, Optical Microlithography VI, vol. 772. p. 74-85 (1987).

Wolf, S. "Advanced Lithography," p. 493-513 in Silicon Processing for the VLSI Era—vol. 1: Process Technology, Lattice Press, Inc. ,1986.

Finders, J. et al. "Low-k1 imaging: how low can we go?" in Microlithographic Techniques in Integrated Circuit Fabrication II, ed. C. A. Mack et al., Proceedings of SPIE vol. 4226 (2000).

International Search Report of International Application PCT/SE2004/000936 mailed Sep. 21, 2004.

Written Opinion of the International Preliminary Examining Authority for International Application No. PCT/SE2005/000269 mailed Mar. 10, 2006.

Written Opinion of the International Searching Authorty for International Application No. PCT/SE2005/000269 mailed on Jul. 14, 2005.

"Reply to written opinion of Jul. 14, 2005" for International Application No. PCT/SE2005/000269 dated Dec. 8, 2005.

International Preliminary Report on Patentability for International Application No. PCT/SE2005/000269 completed May 31, 2006.

1st page of International Preliminary Report on Patentability for International Application No. PCT/EP2005/009921 completed Mar. 20, 2007.

Sandstrom, T. et al. "RET for optical maskless lithography", Proceedings of SPIE—The International Society for Optical Engineering, vol. 5377, No. 1, Feb. 24, 2004, pp. 1750-1763, XP002354538 ISSN: 0277-786X.

Office Action, U.S. Appl. No. 11/228,022, mailed Dec. 22, 2008.

Written Opinion of the International Preliminary Examining Authority for International Application No. PCT/SE2004/000936 mailed Sep. 21, 2004.

International Search Report, Application PCT/SE2004/001161, mailed Dec. 3, 2004.

International Search Report, Application PCT/SE99/00312, mailed Jun. 23, 1999.

International Search Report, Application PCT/SE03/01509, mailed Aug. 1, 2003.

International Search Report, Application PCT/SE02/02245, mailed Feb. 28, 2003.

International Search Report, Application PCT/SE02/00328 mailed Jul. 5, 2002.

Sandstrom et al., Phase-shifting Optical Maskless Lithography enabling ASICs at the 65 and 45 nm nodes, Annual BACUS symposium on photomask technology No. 24, Monterey CA, ETATS-UNIS (Oct. 14, 2004), vol. 5567 (2), pp. 529-544 [Note(s) : XIX, 1450 p., ] [Document : 16 p.] (14 ref.) ISBN 0-8194-5513-X.

Gale M T et al.: "Replication technology for optical microsystems" Optics and Lasers in Engineering, Elsevier, vol. 43, No. 3-5, Mar. 1, 2005, pp. 373-386.

Invitation to Pay Additional Fees and Partial International Search for Application No. PCT/IB2009/005765 dated Aug. 31, 2009.

International Search Report, mailed Dec. 2, 2009, International appln No. PCT/IB2009/005765.

* cited by examiner

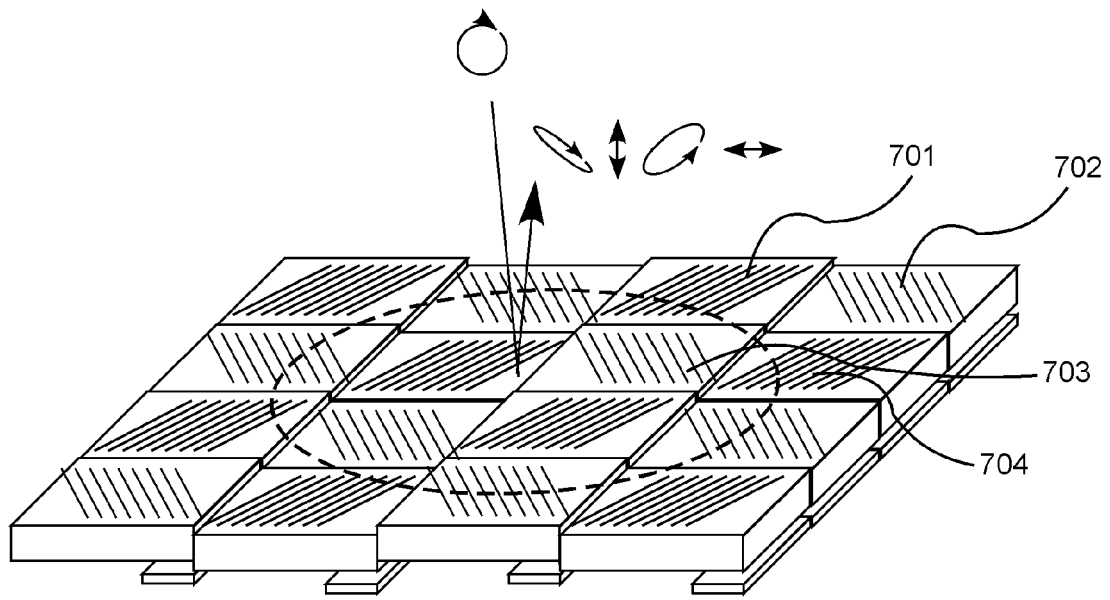
Figure 7a
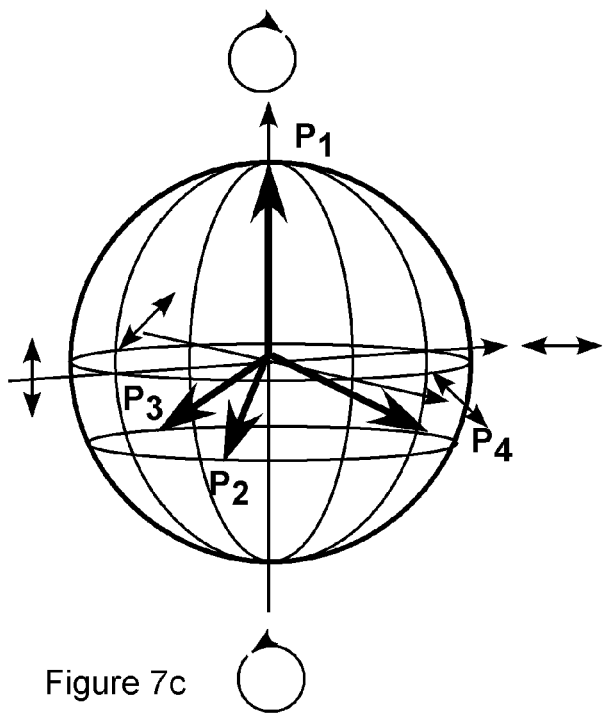
| $P_1$ | $P_2$ | $P_1$ | $P_2$ | $P_1$ | $P_2$ |
|---|---|---|---|---|---|
| $P_3$ | $P_4$ | $P_3$ | $P_4$ | $P_3$ | $P_4$ |
| $P_1$ | $P_2$ | $P_1$ | $P_2$ | $P_1$ | $P_2$ |
| $P_3$ | $P_4$ | $P_3$ | $P_4$ | $P_3$ | $P_4$ |
| $P_1$ | $P_2$ | $P_1$ | $P_2$ | $P_1$ | $P_2$ |
| $P_3$ | $P_4$ | $P_3$ | $P_4$ | $P_3$ | $P_4$ |
Figure 7b
Figure 7c

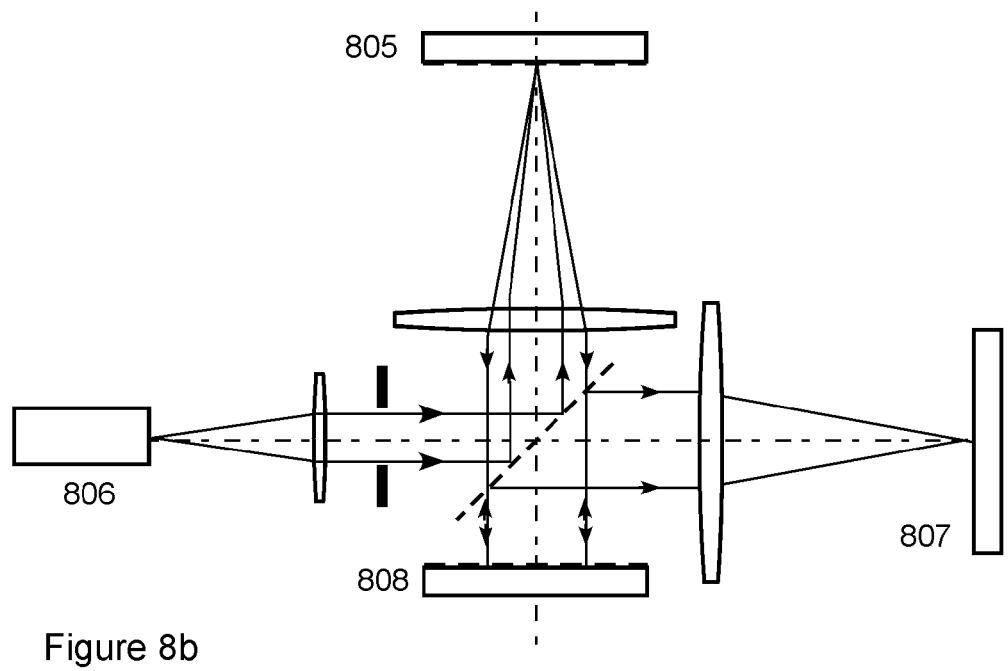
Figure 8b
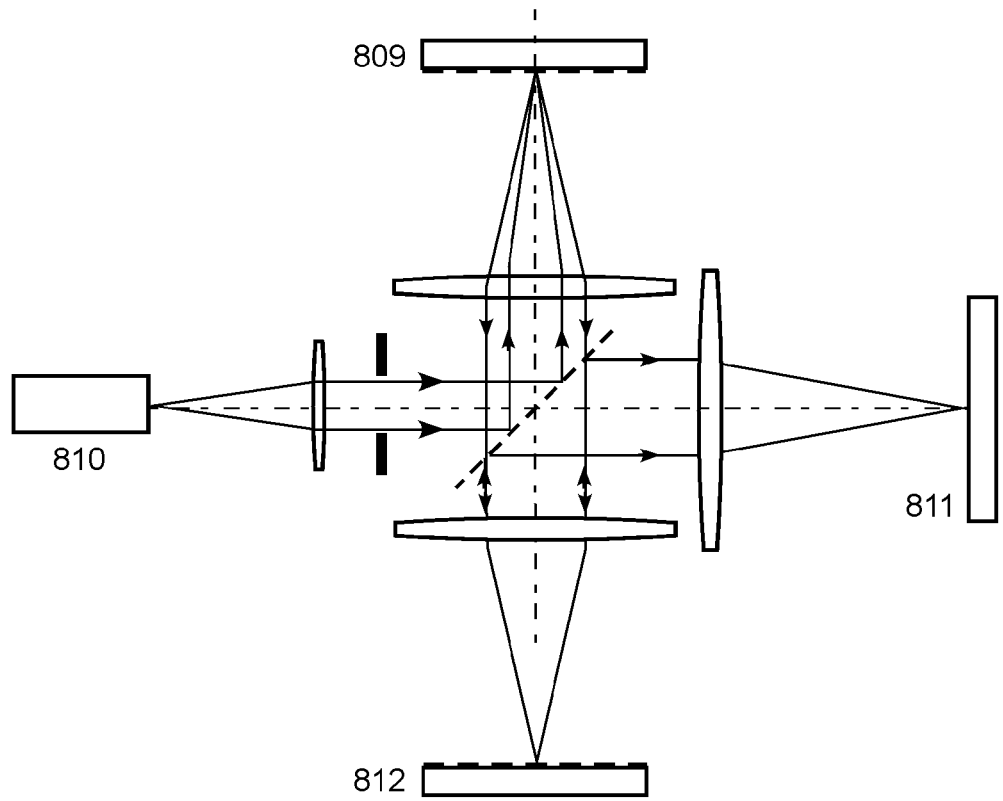
Figurev 8c

SPATIAL LIGHT MODULATOR WITH STRUCTURED MIRROR SURFACES

RELATED APPLICATION

This application claims the benefit U.S. Provisional Patent Application No. 61/047,715 Apr. 24, 2008. The related application is incorporated by reference.

BACKGROUND OF THE INVENTION

SLMs can be transmissive or reflective, based on micromechanical shutters or mirrors, or on reflecting liquid crystals or other electro-optical cells. Much of this invention relates to micromechanical reflecting SLMs, i.e. micromirror arrays. Reflecting micromechanical SLMs have the advantage that they can be inexpensive and stable, and can have high power handling capability and a very high data rate. They can be built in large arrays of many million mirrors and the operating speed is more limited by the data loading speed than the operation of the mirrors themselves, since each mirror may operate in the hundreds of kilohertz or even megahertz range. Were it not for the bottleneck of bringing the data on to the chip a micromirror array could easily operate at $10_{12}$ pixel operations per second. Another advantage is that they can be used with light of very short wavelength, for example in deep UV or even extremely UV (soft x-ray) light.

Many different types of spatial light modulators have been disclosed in patents and at conferences. Four different types of micromirror arrays are technically important and do at the same time illustrate variations in design and operating principles among mirror arrays SLMs: the Texas Instruments' DMD mirror arrays mainly used for projection (U.S. Pat. No. 5,583,688); Micronics' tilting mirrors used for lithography (U.S. Pat. No. 7,009,753) 1§0020 including the SLM with a phase step from /Ljungblad et al./; piston-type SLMs for lithography and wavefront correction shown by Lucent and FhG-IPMS; and one-dimensional arrays for projection displays and lithography by Silicon Light Machines (U.S. Pat. No. 5,459,610). When looking at reflecting micromechanical SLMs it is useful to understand the properties of these array types.

Some work by specular reflection, like TI's DMDs (U.S. Pat. No. 5,583,688), and others by diffraction, like most other types. In diffraction, the phase differences within pixels or between pixels are used to modulate the light. In specular reflection the direction of the pixel surface sends the reflected beam into the accepting aperture of the optics, or outside of it. Another distinction between different SLMs may be if the light is coherent between adjacent mirrors or not. When TI's DMDs are used, the light is typically not coherent between mirrors; in piston-type SLMs it must be coherent; and in Silicon Light Machines' devices it may or may not be coherent between pixels depending on the device and the system design. The third distinction is the type of actuation, that is, whether the mirrors are moving up and down like pistons or tilting like swing boards. A fourth distinction is whether the phase of the electric field, the magnitude, or both are modulated when the mirrors are actuated. Finally, the operation may be on-off ("digital") or have multiple states ("analog").

Analyzing the SLMs above one finds that TI's DMD design falls in a group by itself: specular, incoherent between mirrors, tilting, modulating only the amount of light through the optics, and on-off. Most other devices work by diffraction, have multiple states and at least some degree of coherence between adjacent mirrors. We may call these two groups incoherent and coherent modulators. Among coherent modulators, i.e. the SLMs from Micronic, Silicon Light Machines, FhG-IPMS and Lucent, the type of modulation and the type of actuation varies.

A common property of diffractive SLMs is that they are monochromatic. They create darkness through destructive interference and the destructive phase relation is perfect at only one wavelength. Many SLMs can be used for different wavelengths by using one wavelength at a time and tuning the (analog) actuation between different wavelengths.

Diffractive, micromirror arrays typically change the phase of the electric field, its magnitude, or a combination of both when they are actuated. This can be described as a trajectory in the complex plane, the trajectory that the reflected E-field phasor traces in the complex plane when the mirror is gradually activated from relaxed to fully activated. Different applications require or are best served by different trajectories and the trajectory of an SLM can be modified by the methods disclosed, in particular, by creation of height steps and other surface profiles on the mirror surface.

Apply surface profiles with a variety of properties, can be built using the same driving circuits, by only modifying the surface profiles of the micro mirrors.

Still another aspect of the invention is that tilting mirrors can be made into fully complex modulators by means of height steps. Fully complex modulation is known in the art (Florence, J. M., "Full Complex Spatial Filtering with a Phase Mostly DMD", Proc. SPIE 1558, pp. 487-498 (1991); U.S. Pat. No. 7,227,687).

Texas Instruments' DLP micromirror arrays for digital projectors and digital cinema are reflective micromechanical SLMs. The recent availability of TI's devices on OEM basis has spawned a wide range of industrial applications. TI's micromirrors are non-coherent on-off modulators which essentially turn the light on and off at each mirror. These modulators have been applied with considerable ingenuity to a variety of applications. Some applications are best served by a SLM with a coherent illumination source and, therefore, are not well served by the DMD. The success of the DMD in OEM applications shows the power of the SLM as an optical building block, but there are still large application fields waiting for the ideal SLM to emerge. The SLMs disclosed in this application are intended to advance SLM technology towards usefulness in these other application fields.

Coherent spatial light modulators, which preserve the phase and coherence properties of the light from mirror to mirror, have been used for lithography by Micronic Laser. A diffractive micromirror array is used as an image modulator and to project deep UV light on photoresist, creating a pattern with features as small as 0.1 microns.

One difference between non-coherent and coherent modulators is the amount of movement. A coherent or diffractive modulator has mirrors which move by a fraction of the wavelength, while non-coherent modulators have mirror flaps which tilt to send the specular reflection in a different direction. The non-coherent modulators tip tens of wavelengths at their edge. A coherent modulator may form a perfect phase surface, while the phase is less well-controlled or not controlled at all in a non-coherent modulator. Good phase control is important in certain applications like holography and wave front correction.

There are two main types of diffractive micromechanical modulators: piston mirrors and tilting mirrors. A piston mirror moves up and down, changing the phase of the light that is reflected from it, while keeping the magnitude of the reflected light constant. A tilting mirror has the opposite properties: it changes the magnitude of the reflected light while keeping its phase constant. These two types have different applications.

The piston type is better for beam steering, wave front correction, and holography. The tilting type on the other hand is better for high quality lithography. However, the applications overlap. The piston type can be used to lithography with a more complex rasterization. Moreover, in some applications neither type is perfect, since what is needed is really a fully complex device which can modulate both magnitudes and phases. For example, holography needs a fully complex modulator, and both tilting and piston modulators are approximations. An important property of fully complex modulators is that they can be used to form diffraction patterns close to the optical axis with good suppression of zero-order (i.e. non-diffracted) light and of mirror (a.k.a. conjugate) and higher-order images.

SUMMARY OF THE INVENTION

The invention relates to methods to improve SLMs, in particular to reflecting micromechanical SLMs, for applications with simple system architecture, high precision, high power handling capability, high throughput, and/or high optical processing capability. Applications include optical data processing, image projection, lithography, image enhancement, holography, optical metrology, coherence and wavefront control, and adaptive optics. A particular aspect of the invention is the achromatization of diffractive SLMs so they can be used with multiple wavelengths sequentially, simultaneously or as a result of spectral broadening in very short pulses.

BRIEF DESCRIPTION OF THE DRAWINGS

FIG. 2a shows a complex plane with a unit circle and phasors (vectors) depicting the complex amplitude of the light reflected from two mirrors in the array in FIG. 1a.

FIG. 6b shows in schematic form the reflection versus wavelength of the areas $A_1$ and $A_2$ in FIG. 6a.

FIG. 7a shows a mirror array where the mirrors have a surface which modify the polarization of the reflected light.

FIG. 7b show the mirror array which can be used to create an arbitrary polarized light beam.

FIG. 7c shows a Poincare-sphere with four polarization states which can create an arbitrary polarization.

FIG. 8b-d show imaging systems where at least one SLM according to the invention is used to enhance the image of an object.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1A:
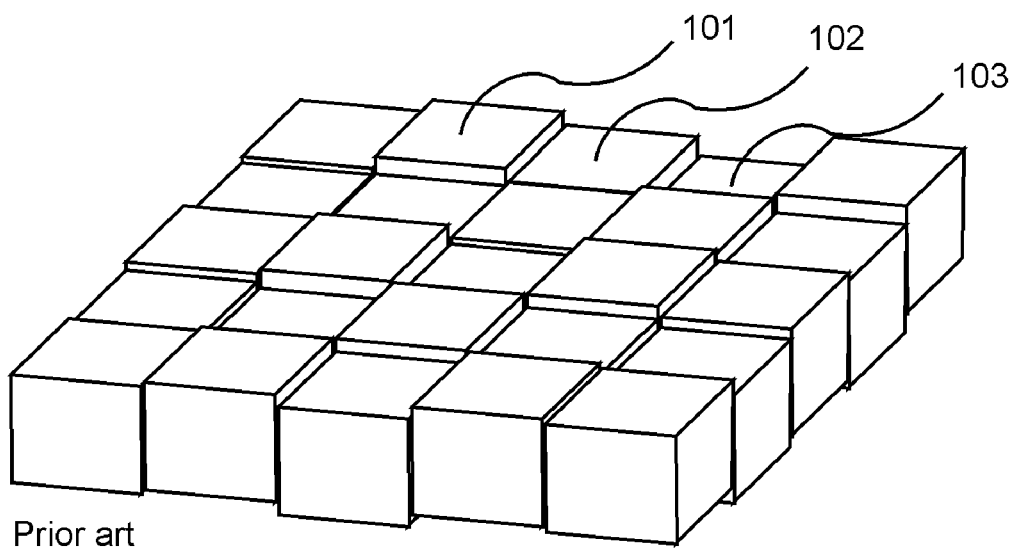
FIG. 1a shows the piston mirror array known in prior art.

FIG. 1 shows a spatial light modulator in prior art. It has an array of pixels, which can be one or two dimensional, dense or interspersed with passive areas. Each pixel, which may be a mirror, may move up or down so that a light field which impinges from the top, is reflected with a different phase depending on the height of the mirror or pixel. Mirror arrays as the one in FIG. 1a are used for wavefront correction, signal processing, beam steering, and for lithography as discussed above. The height of each pixel is calculated beforehand and the height information, e.g., in the form of a voltage, is fed to the actuators moving the mirrors up and down creating a desired image or wavefront.

The mirrors in FIG. 1 are flat. I will now show how the properties of these SLM pixels and others, can be altered and tailored to specific application needs by the addition of a surface structure, in particular by phase steps and subwavelength periodic structures.

The calculation of the mirror position giving the desired image can be made for a single wavelength. For other wavelengths, it will not generally be right. Assume, for example, that the light reflected off every second mirror in FIG. 1a has the electric phase 0 degrees. The other mirrors (or rather the light from them) have the phase 180 degrees at the nominal wavelength 633 nm. The result is that the electric field amplitudes cancel since they have the same magnitude but opposite phases. In the specular direction (the zero diffraction order), there will be no reflected light. The zero order is perfectly extinguished by destructive interference.

But if light of a different wavelength, e.g. 405 nm, is reflected off the same mirrors the phase between the two types of mirrors at 405 nm is 281 degrees. The destructive interference is destroyed and there will be significant light in the zero diffracted order. If the phase angle is $\delta$ and the wavelength is $\lambda$, there is a finite derivative $d\delta/d\lambda$, which will govern the loss of extinction. In the example above $d\delta/d\lambda$ is approximately $(281-180)/(405-633)=-0.44$ degrees per nm.

Figure 1B:
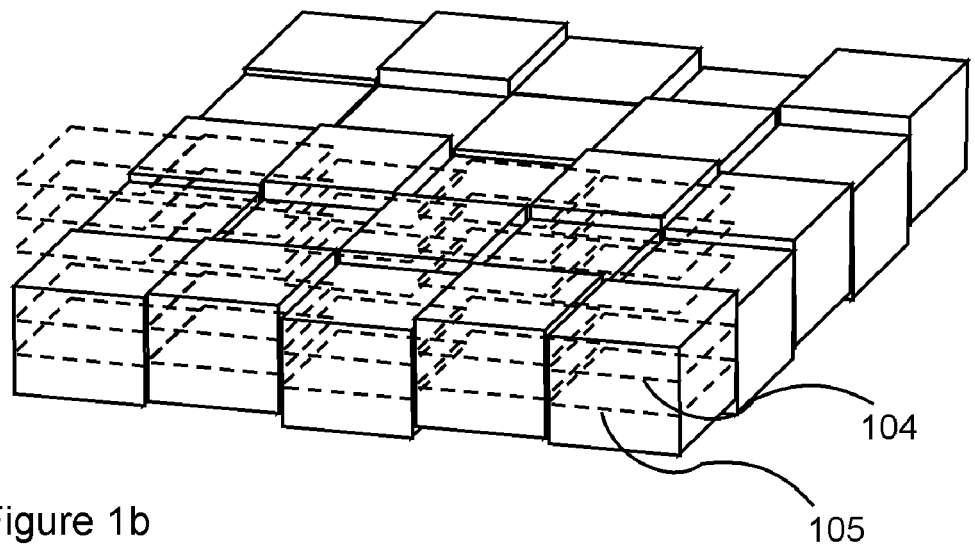
FIG. 1b shows the same piston mirror array as in FIG. 1a, but with optically equivalent positions for the closest row of mirrors.

FIG. 1b shows each of the mirrors in the first row in FIG. 1a in alternative positions which are displaced exactly half a wavelength at the nominal wavelength 633 nm. At 633 nm it is impossible to see in the reflected field (neglecting near-field effects at the boundaries between the mirrors) which one of the alternative positions are used, since the phase difference between two alternative positions is exactly one wave-length (half a wavelength times two, since the light is reflected). Any of the alternative position can be used for each mirror and it will not affect the reflection at 633 nm.

However, at a different wavelength there is strong difference between the phases of the alternative positions computed for 633 nm, since the alternative positions have different values of $d\delta/d\lambda$. In particular, some alternative positions will have positive and some will have negative $d\delta/d\lambda$. By choosing alternative positions for some of the mirrors, or for certain parts of the mirrors, it is possible to cancel the dependence on wavelength. If half of the mirrors have phase 0, and the other half are divided into equal area of phase −180 and +180 degrees, there will be a first-order cancellation of the derivatives and the extinction will be wavelength independent for small wavelength shifts.

A more thorough analysis will show that there is also a second-order effect: the mirror with 50%+180 and 50%−180 degrees will have an average reflectivity that is reduced by a quadratic function of the wavelength error. The next level of correction is to make the 0 degree mirror into 50% 0 degree, 25%+360 degrees, and 25%−360 degrees. In this way, gradually higher orders of achromatization can be added to the array, achromatization in the sense that good extinction for one wavelength is also good extinction for adjacent wavelengths.

The principle of the achromatization is that a phase difference of $\delta_0$ at $\lambda_0$ gives a derivative $d\delta/d\lambda=-\delta_0/\lambda_0$ and the equivalent (at $\lambda_0$) $\delta_0-360$ degrees gives the derivative $d\delta/d\lambda=(360-\delta_0)/\lambda_0$, if an area A with phase $\delta_0$ is divided into one part with phase $\delta_1=\delta_0$ and area $A_1=A*((360-\delta_0)/360)$ and one part with phase $\delta_2=\delta_0-360$ and area $A_2=A*(\delta_0/360)$.

This, and more complex cases, can be solved by looking at the derivatives $d(\text{Re}(E_{total}))/d\lambda$ and $d(\text{Im}(E_{total}))/d\lambda$, where $E_{total}$ is the integrated complex E field (as aphasor) over the area A and Re and Im denote the real and imaginary fields of it, and setting them equal to zero. More complete achromatization follows if also $d^n(\text{Re}(E_{total}))/d\lambda^n$ and $d^n(\text{Im}(E_{total}))/d\lambda^n$, where n is 2, 3 or larger, are set to zero or minimized over the wavelength span.

Figure 2A:
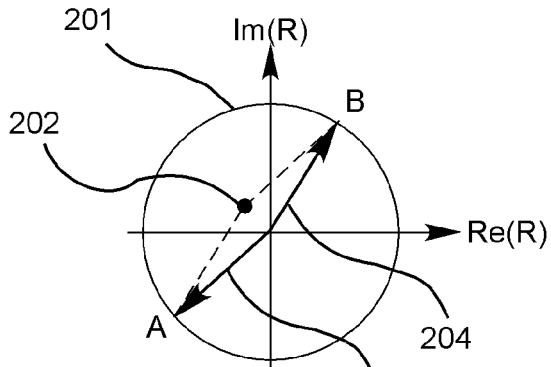

FIG. 2a shows in the complex plane 201 how an arbitrary complex value 202 is created by two piston areas A and B represented by the two phasors 203 and 204. Each phasor represents the complex amplitude reflection R, and when the phase changes the phasor rotates around the origin. By choosing the angles of the two phasors 203 and 204 they can be made to add up to the desired complex reflection coefficient 202. This is true only for one wavelength and diffractive components are usually considered to be single-wavelength devices.

Figure 2B:
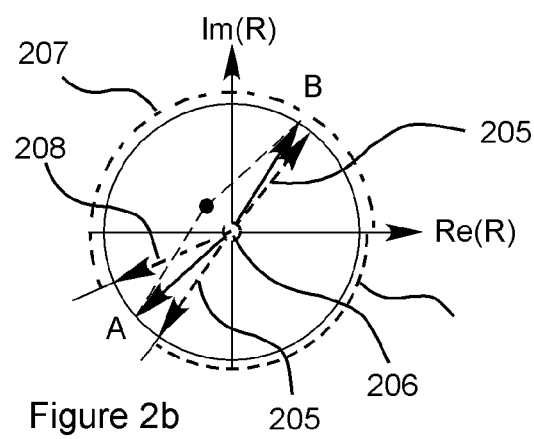
FIG. 2b shows the same complex plane with phasors for two mirrors, the same phasors as in 2a at a longer wavelength, and one of the phasors at the longer wavelength reflected by mirrors with a different position, as illustrated in FIG. 1b.

What happens when the wavelength changes is shown in FIG. 2b. The phases for a certain mirror height become smaller in degrees since the wavelength is longer, the dashed phasors 205. The integrated complex amplitude then becomes 206, which in the example is close to the origin. However, if the phase of A is changed by 360 degrees at the design wavelength, the phasor gets an opposite dependence on wavelength so the phase of A becomes larger with longer wavelength (opposite dependence of 205). By dividing the area A into one part like 205 and one part like 208, the combined phasor can be made independent of the wavelength. If the same is done with the phasor 205, the point 202 can be made independent of wavelength.

A piston mirror may have a long stroke, i.e., it may be used to produce phase angles from 0 to 360 degrees or even outside of one single period. The method for achromatization described above works best at a smaller range of phase angle. Therefore, it is desirable to input to the achromatization the most likely or most critical phase range. Typically, this is the angle where extinction is created by destructive interference. The achromatization is then done by minimizing the change in the phasors for this critical range.

Figure 2C:
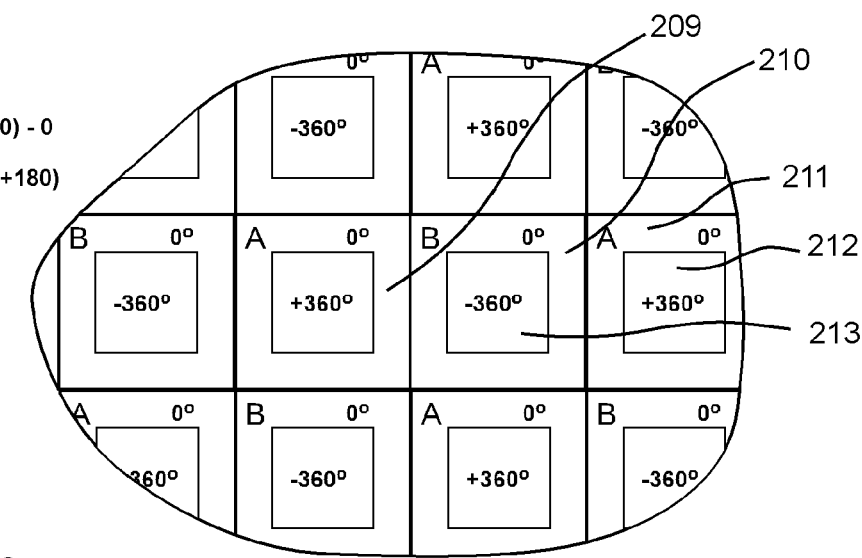
FIG. 2c shows a top view of mirrors which are achromatized for specific operating conditions described in the text.

FIG. 2c is an example of achromatization of piston mirrors where the above critical range can be seen. FIG. 2c shows a regular Cartesian array of piston mirrors which can be actuating up and down. They are divided into A and B mirrors corresponding to the black and white squares on a checker board. The "black" mirrors A 209 are preferably used in the range −180-0 degrees and the "white" mirrors B 210 are preferably used in the range 0-180 degrees. To make a dark area, the A mirrors are actuated to −90 degrees and the B mirrors to 90 degrees at the nominal wavelength. The difference is 180 degrees and the mirrors extinguish the zero order by destructive interference. At a longer wavelength, the phase difference for flat mirrors would be smaller and the extinction less complete. With flat mirrors, the zero order would be extinguished at the nominal wavelength, i.e., 550 nm at the center of the visible range. Longer and shorter wavelengths would leak through and the zero order would have a purple color, a mixture between red and blue.

However, the mirrors in FIG. 2c are achromatized by having one area 211 with phase 0 and an area 212 which has a +360 degree higher phase for the A mirrors and 360 nm lower phase for B mirrors. The size of the area 212 as a portion of the total piston mirror determines at which phase each mirror has best achromatization. To be optimal at the nominal extinction −90 and +90 degrees, the shifted area 212 should be one third of the non-shifted area 211. The extinction of the zero order is then good for all wavelengths in an extended range around a center wavelength and the zero order is black, not purple. By an extended range we mean 0-60 nm, preferably 100 nm or more. It is expected that technology disclosed is capable of producing extension of the zero order across the visible spectrum; that is, across a range of wavelengths of about 400 nm to 750 nm, or a range of λ to 2λ, or a range of λ to λ+350 nm.

Figure 2D:
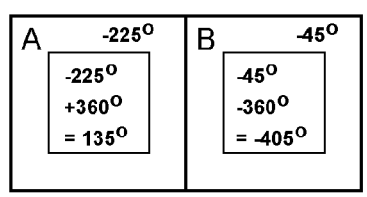
FIG. 2d shows two mirrors which are pre-biased to operate in the conditions of FIG. 2c.

In FIG. 2d a bias is added to the mirrors so that, first, the same force is needed for both A and B mirrors to bring it to the center of each one's preferred range, and second, there is a 45 degrees bias to make sure that all mirrors even in the presence of some variation between mirrors can be brought to the angles −180 and 0 degrees.

The step height needed for the achromatization is typically around 180 degrees of phase of the center wavelength. For visible wavelength and operation in gas or vacuum the center wavelength is approximately 540 nm and the physical step height 270 nm. The height of the phase step in /Ljungblad/ is 90 degrees and phase bias steps often 45 degrees. This has two consequences: first the different schemes can be added and, second, height differences above 135 degrees are affecting the wavelength correction of a device and may have been added for achromatization.

Tilting Mirrors

Figure 3A:
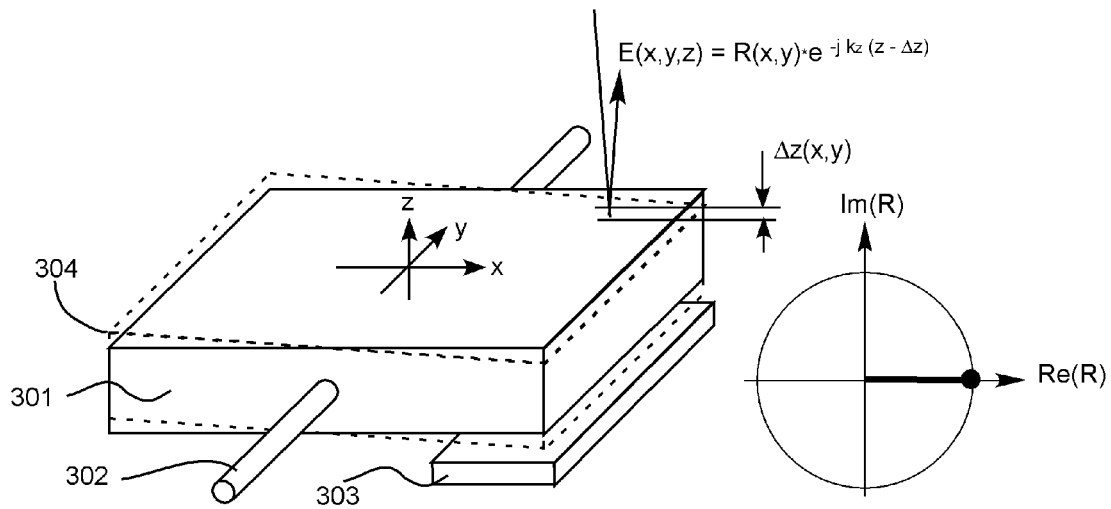
FIG. 3a shows the tilting mirror with the torsional hinge and a complex plane with the locus of available reflected complex amplitudes.

Sandstrom, Hornbeck, and Ljungblad describe various types of tilting mirrors. FIG. 3a shows a mirror 301 with a torsion hinge 302 and an electrostatic actuator 303. The average complex reflection coefficient can be found by integration of the reflection over the surface with the phase factor which comes from the position and tilt angle 304. When the mirror is perpendicular to the light, the reflection coefficient is 1+0j (if we remove the reflectivity loss of the material and the losses in the slits around the mirror by normalization.) When the mirror tilts to successively larger angles, the average reflection coefficient goes from 1+0j to 0+0j (actually to −0.2+0j) along a straight line as shown in the complex plane inset in FIG. 3a.

Figure 3B:
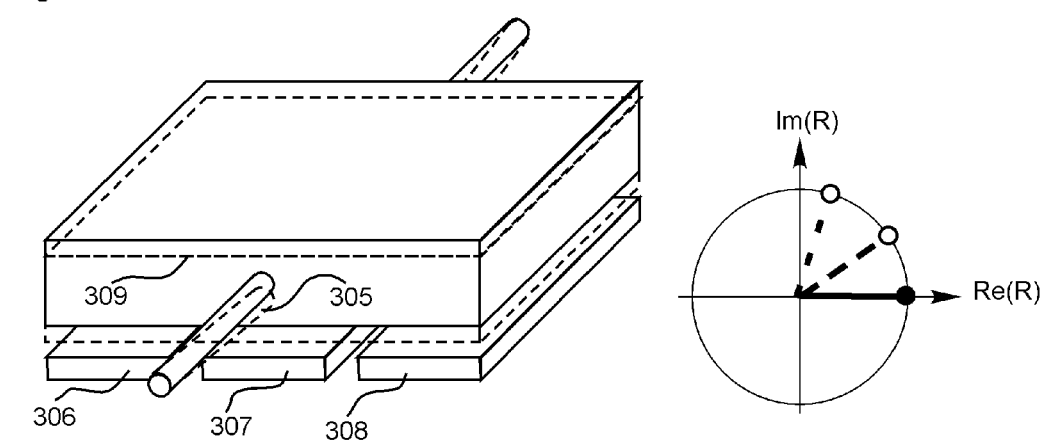
FIG. 3b shows the tilting mirror with a torsional hinge allowing some piston action, and the available complex amplitudes.

In FIG. 3b, the torsional hinges 305 may also bend to create a piston effect. In the embodiment shown in FIG. 3b, there are multiple actuators 306, 307, 308. By applying different forces to the actuators one may tilt the mirror, pull it towards the actuators without tilt, or do a combined action. The combined force from the actuators cause a piston action 309, the difference between the right and left actuator cause the tilt, and these movements can be calibrated and used to control the mirror to give an arbitrary complex reflection coefficient. The mirror in FIG. 3b with two or more actuators may be made into large arrays to be used as fully complex spatial light modulators. How the arbitrary reflection coefficient is created is shown in the inset complex plane. When the mirror tilts, the reflection coefficient changes from high reflection on the unit circle to no reflection at all at the origin. The piston action causes the trajectory to rotate around the origin. Any point in the complex plane can be reached by a combination of tilt (radius) and piston (rotation).

Figure 3C:
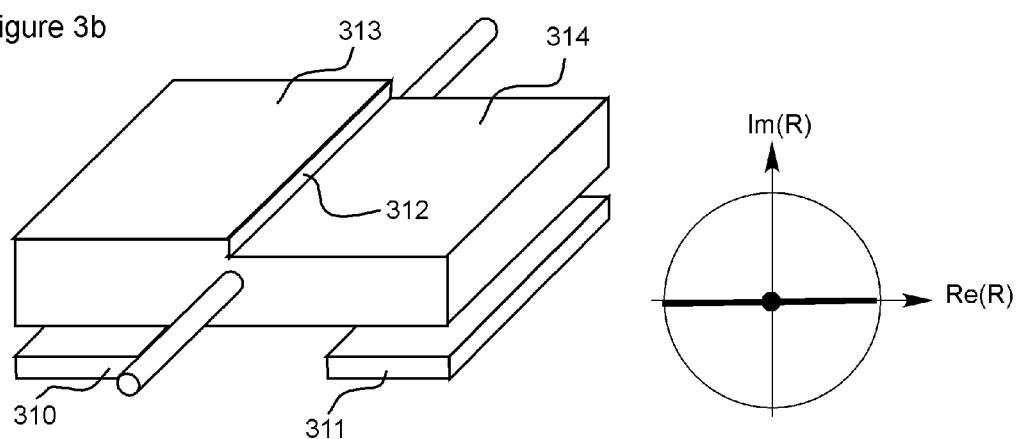
FIG. 3c shows the tilting near where the phase step, having both positive and negative available complex amplitudes along the real axis.
Figure 3D:
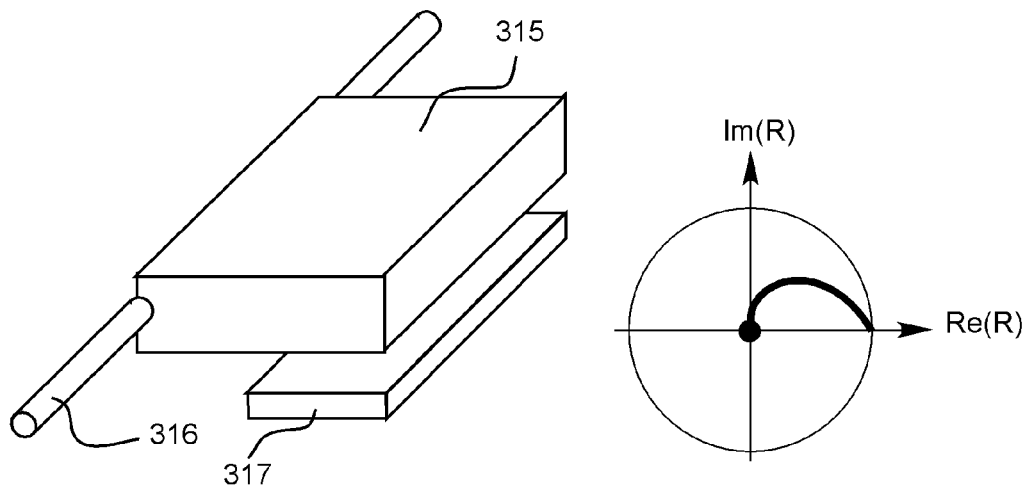
FIG. 3d shows a tilting mirror where the hinge and the axis of rotation is at the edge of the mirror surface and the resulting locus of amplitudes.
Figure 3E:
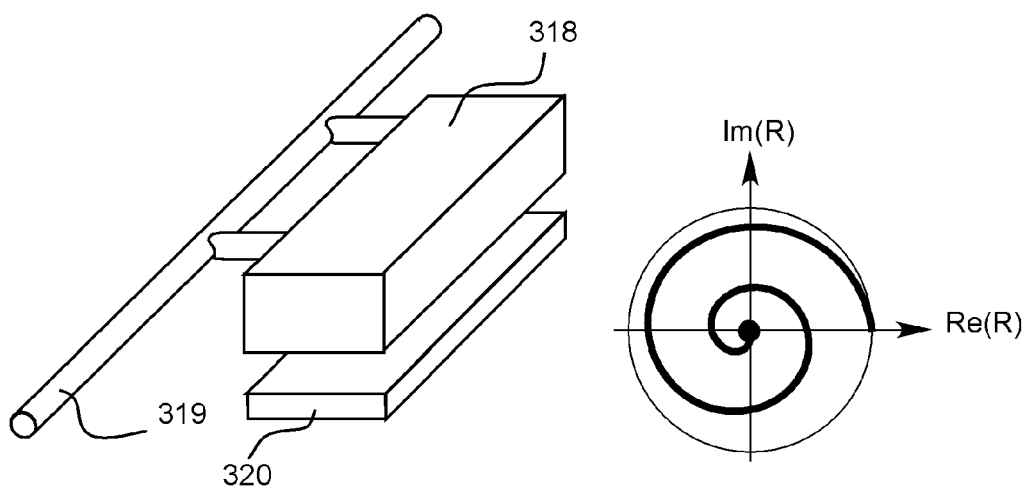
FIG. 3e shows a tilting mirror where the hinge and the axis of rotation is outside of the mirror surface and the resulting locus of amplitudes.

FIG. 3c shows a mirror with a phase step 312, between reflecting surfaces 313 and 314, which produces 180 degrees delay at the nominal wavelength or 90 degrees in height. This step extinguishes the zero order when the reflecting surfaces are perpendicular to the incident light (U.S. Pat. No. 7,110, 159). When the mirror tilts to one side, it becomes bright with a phase of 0 degrees, and when it tilts to the other side if becomes bright with a phase which is 180 degrees. This phase step mirror can be combined with the piston action in FIG. 3b and give an arbitrary complex reflection coefficient with only half as much piston movement as the mirror in FIG. 3b.

Figure 4A:
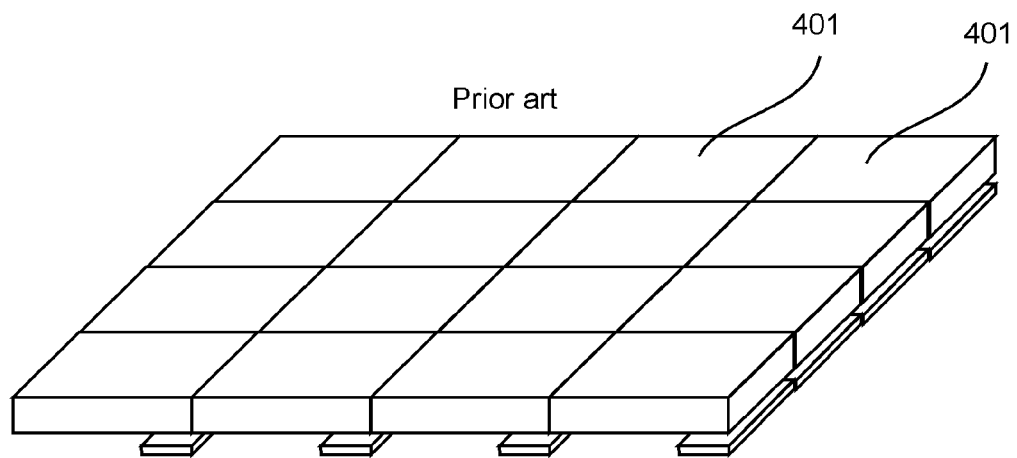
FIG. 4a shows an array of tilting mirrors as known in prior art.
Figure 4B:
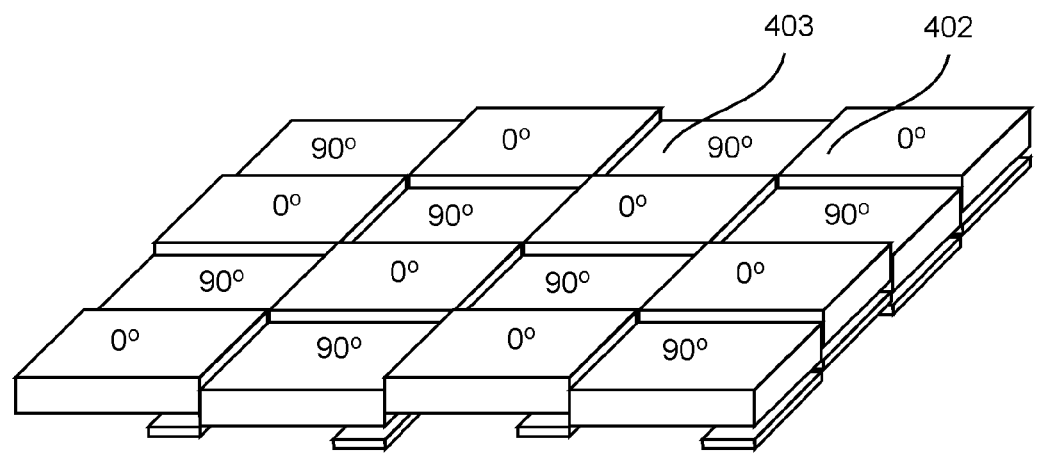
FIG. 4b shows an array of tilting mirrors having a phase bias.

However, mirrors with both piston and tilt action are mechanically complex and it is desirable to have fully complex modulation with a simpler mechanical structure, as will be shown in the following. The piston movement can be replaced by a fixed vertical offset of some of the mirrors. FIG. 4a shows a mirror array as known in prior art. Each mirror can be tilted to one side. This type of array is used for lithography (U.S. Pat. No. 7,009,753). In FIG. 4b the array has half of the mirrors displaced by 90 degrees in phase. Half of the mirrors have reflectivity going from 0+0j to 1+0j and the other mirrors from 0+0j to 0+1j. The two types are arranged in a checkerboard pattern. Row or columnwise and other dense patterns are also possible. If the optical system does not resolve the individual mirrors, the average over two or more mirrors of complex reflection coefficients with magnitude from 0 to 1 and phase from 0 to 90 degrees can be created by superposition of the two types. This does not allow for full complex SLMs, but for an SLM where the phase angle can be tuned by the driving.

Figure 4C:
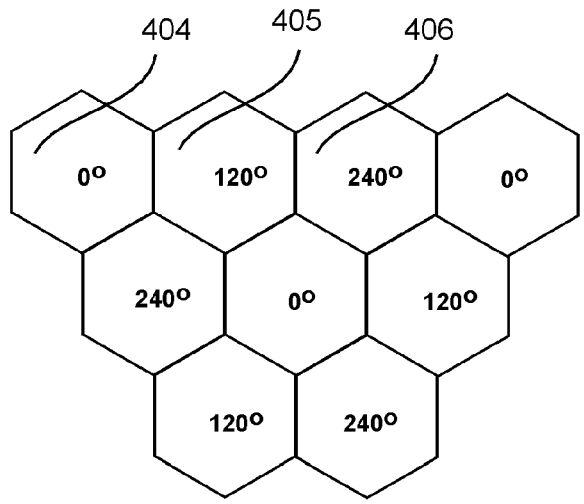
FIG. 4c shows at hexagonal array of mirrors with three values of bias.

In FIG. 4c, a hexagonal pattern with three types of mirrors is shown. Type one has 0 degrees, and types two and three have relative phases of 120 and 240 degrees, respectively. Any phase angle from 0 to 360 degrees can be synthesized by a combination of the three types. In fact, any complex coefficient can be synthesized within a hexagon with the corners in 1+0j, 0.5+sqrt(3/4)j, −0.5−sqrt(3/4)j, etc.

Figure 4D:
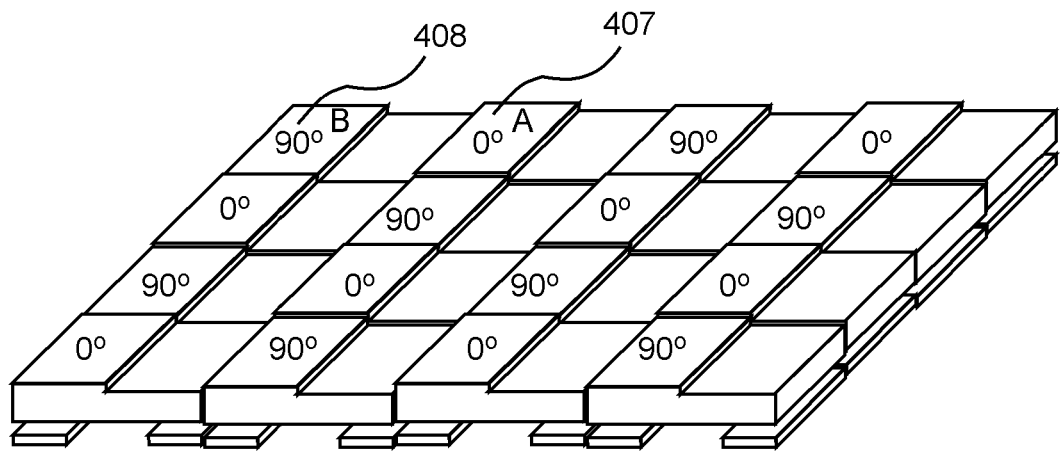
FIG. 4d shows an array of phase step mirrors where some mirrors have a phase bias.
Figure 4E:
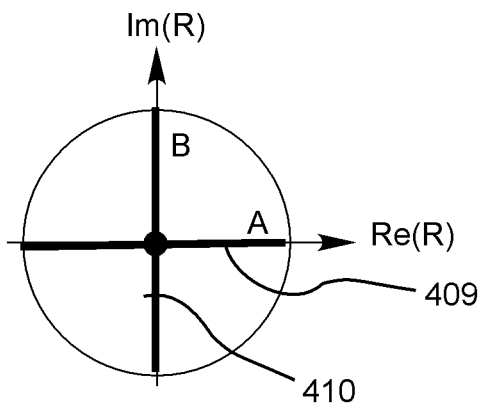
FIG. 4e shows available complex amplitudes from the mirrors marked A and B in FIG. 4d.
Figure 4F:
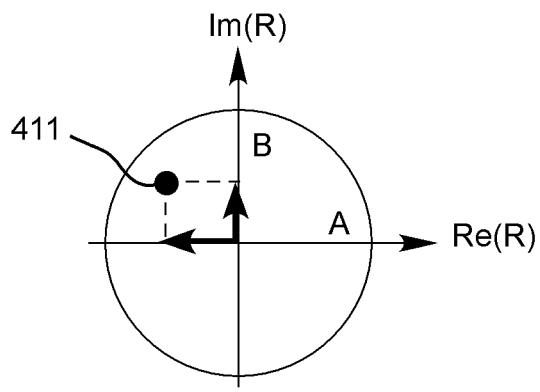
FIG. 4f shows how an arbitrary complex amplitude can be created by amplitudes from mirrors of type A and type B.

FIG. 4d shows a checkerboard pattern like in FIG. 4b, but with phase-step mirrors like in FIG. 3c. Each mirror can modulate from −1+0j to +1+0j or 0−1j to 0+1j. Two mirrors together can synthesize any complex reflection coefficient within the unit circle, i.e., the SLM in FIG. 4d is a fully complex modulator. How this works is described in FIGS. 4e and 4f. The A mirrors give reflection along the line A in the complex plane in FIG. 4e. The B mirrors follow the line B. The lines A and B may be called loci or trajectories for the two types of mirrors. The arbitrary point shown by the dark spot in FIG. 4f can be synthesized as the summation of two phasors, one along the A trajectory and one along the B trajectory.

Therefore, FIG. 4d shows a fully complex spatial light modulator which can be used for many applications: pattern generation, beam shaping, beam steering, signal processing, encryption, filtering, real-time holography, and many other uses in instruments and industrial processes.

Achromatizing Tilting Mirrors

Figures 5A, 5B, 5C, 5D, 5E, 5F:
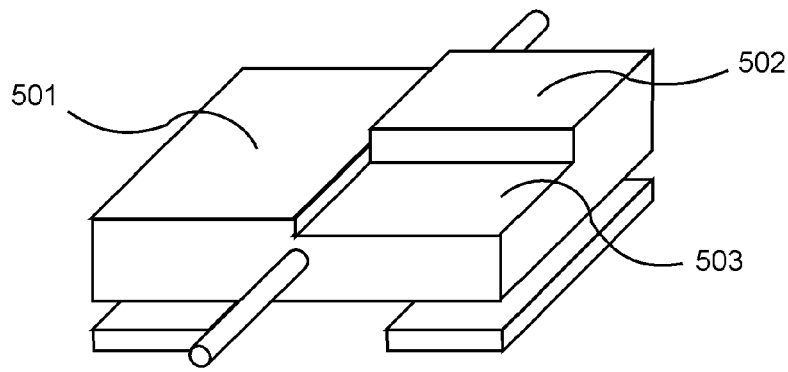
FIG. 5a shows an achromatized phase step mirror.
FIGS. 5b and 5c show top views of two achromatized phase step mirrors.
FIG. 5d shows eight mirrors with an achromatized phase bias.
FIGS. 5e and 5f show alternative implementations of two phase step mirrors with a phase bias.

The step height in FIG. 3c is achromatized in a similar fashion as described in elation to FIG. 2c. The phase step in prior art /Ljungblad/ coincides with the tilt axis. Achromatization is done by subdividing the mirror areas on each side of the tilt axis/phase step into partial areas and adding height differences between them. The first order result is the mirror shown in FIGS. 5a and 5b. One side 501 of the mirror has the phase angle 0 degrees, and the other is divided between two areas of equal size 502, 503 and −180 and +180 degrees at the nominal wavelength. This makes the phase difference between the two sides independent of wavelength in the first order. This may be adequate for small wavelength changes. For larger wavelength offset, there will be a difference in the magnitude of the integrated E-field between the two sides, since the phase angle between the +180 and −180 degree areas will grow with larger wavelength error. FIG. 5d shows a mirror which corrects also for this effect. The 0 degree side has 25% area which has phase −360 degrees and 25% with −360 degrees. The result is a mirror where the phase step is achromatized over a wide range of wavelengths. Achromatization in this context is understood to mean that the zero order reflection is black. For instance, zero order reflection is extinguished over a wide wavelength range such as the entire visible range or so that laser sources of differing wavelengths, such as 355 nm and 405 nm, can be used interchangeably without changing the SLM design. As described above, the range of wavelength variation over which extraction is effective may be 0-60 nm, 0-100 nm, 0-350 nm, or at least 350 nm.

Other phase differences can be achromatized and the achromatizations can be combined. An SLM array with a phase difference of 90 degrees as in FIG. 4b is achromatized in FIG. 5d. The figure shows eight mirrors with a checkerboard pattern of 90 degree offset mirrors. The mirror with a 90 degree phase is divided into a larger area with 90 degree phase and a smaller area with 90-360 degrees. Like above, a negative phase is achromatized by adding n*360 degrees to part of the area, or vise versa, where n is a natural number larger or equal to 1. The areas' ratios follow the relations given above, such that the areas assigned to each phase are proportional to the inverse of the phase difference between said areas and the reference area, 0 degrees in this example embodiment. For the tilting mirrors, the splitting of the area may be made along lines perpendicular to the axis the mirror tilt around. However, other shapes or patterns are also possible as will be described below.

The array of phase-step mirrors can be achromatized as shown in FIGS. 5e and 5f. Each figure shows two mirrors, one with a phase of 0 and one with a 90 degree phase. The two achromatizations in FIG. 5b (or 5c) and in 5d are combined. FIG. 5f shows the same achromatization as in 5e which just adds the phases in a point-by-point fashion, but with the area elements rearranged to avoid splitting the mirror area into too small elements.

Figure 6A:
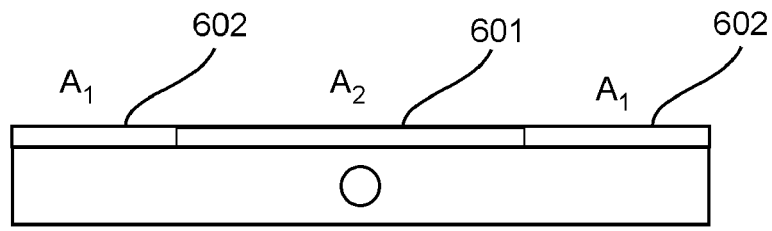
FIG. 6a shows an achromatized tilting mirror.
Figure 6B:
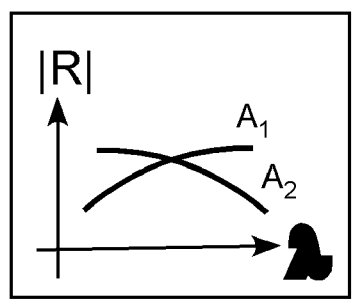
Figure 6C:
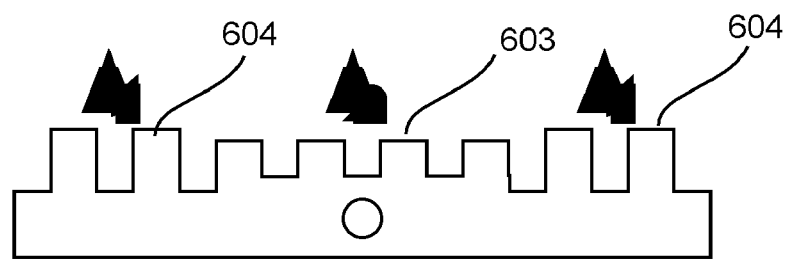
FIG. 6c shows how the achromatized areas can be created by a surface pattern.

The trajectory of the reflection coefficient as function of tilt angle of the tilting mirrors may be achromatized as follows. FIG. 6a shows a mirror like in 2a or 2b where the surface have areas $A_1$ and $A_2$ with different spectral reflectivity as shown in FIG. 6b. The area farther away from the center of rotation $A_1$ has higher reflection for long wavelengths. The vertical motion of the surface is larger far away from the center of rotation and will be more suitable for the long wavelengths. Inversely shorter wavelengths are more strongly reflected near the center of rotation where the vertical travel is smaller. The result is that the same tilt angle may produce extinction for both short and long wavelengths. The spectral characteristics in FIG. 6b may be created by anti-reflection coating selectively applied to different parts of the mirror. FIG. 6c shows how the same effect can be obtained by a height profile on the mirror. The figure shows the area $A_2$ near the hinge in the center of the mirror divided into smaller area elements with −180 and +180 degrees phase for a short wavelength, e.g. 440 nm. Since the phase angle +180 and −180 degrees are really the same phase, the reflectivity is high for the wavelength 440 nm but lower for wavelengths which are longer or shorter than 440 nm. Likewise, the areas $A_1$ may have the same type of pattern but tuned to have high reflectivity at a longer wavelength, e.g. 650 nm. The wavelength selectivity may be increased by using larger values of n with the phases +n*180 and −n*180 degrees, and be made smaller by patterning only part of the mirror surface. In this way the mirror achromatization may be tuned to the requirements.

Figure 6D:
FIG. 6d shows the combination of the pattern in FIG. 5f and FIG. 6c.

FIG. 6d shows how the tilting, the phase step and the phase difference between the mirrors can be achromatized simultaneously by adding point by point phases from FIG. 5f and 6c. The mirror surface is now rather complex. The point to point phase map can be derived as shown above, but it may also be possible to derive other similar patterns with an equivalent function. One way to do so is to divide the area into small elementary areas elements, each one with a height which is numerically calculated and designed to give the characteristics which are needed, in particular the dependence of mirror properties on wavelength. The desired behavior is set up, and a merit function which represents how close the simulated behavior is to the desired one. The height (and optionally reflectivity) of the elementary area elements are then varied until a satisfactory merit function is derived. Many numerical methods exist which can be used for the calculation of the attern, e.g. in MATLAB.

Manufacturing of the Mirror Surface

The mirrors designed to be achromatic will have areas with different heights on their surface. The mirrors may be 16×16 microns large and made from metal, silicon or other materials. The steps on the surface may be created by etching of the mirror material or by etching or deposition of thin films on the surface of the mirror. The surface may be metalized or coated with other reflecting films. A preferred embodiment of the SLM has a polymer film nano-imprinted with a depth pattern from a template, i.e. the template is pushed toward the mirror and the gap filled with a UV-hardening compound. After the compound has hardened the template is removed and a reflecting film is deposited on top of it. Alternatively, the depth profile in the UV hardened compound film is transferred into the mirror by etching.

SLMs with Polarization Modulation

In many cases it may be desirable to spatially modulate the polarization of a beam. An example is that desired and undesired light in a high-power beam can be safely sorted out and the undesired light energy dumped if it is polarization coded. Another is for instrument technology, e.g. it may be possible to build a high-resolving Mueller matrix microscope by first spatially modulating the illumination by an SLM, then spatially analyzing the polarization coming back from the specimen by another polarization SLM and a detector array.

FIG. 7a shows an SLM with polarization-modifying pixels which, when it is illuminated with polarized light, will reflect a pattern of light polarized light with different polarization from point to point. The surface of each mirror has a fine polarization-modifying pattern or microstructure which affects the polarization of the reflected light. One possibility is to use a wire grid polarizer, so that one polarization is reflected and the complementary polarization is absorbed by the surface. Another possibility is that the fine pattern has different phase delay between one direction of polarization and the opposite one, acting in fact as a retarder. The fine patterns may be formed in the surface of the mirror or in a separate film, e.g. dielectric film, deposited on the mirror. The patterns, which typically have lateral feature dimensions smaller than the wavelength of the light intended to be modulated, may be written with ebeam lithography for experiments and produced by nanoimprinting in volume production. The patterns are designed based on full electromagnetic solution of Maxwell's equations for the pattern. Typically the patterns will be periodic and the reflection properties can be solved by RCWA (Rigorous Coupled-Wave Analysis), using codes that are commercially available.

Different pixels 701, 702, 703, 704 have different polarizations and they may have phase steps and/or phase differences from pixel to pixel, and by actuating the pixels to reflect more or less of the light the magnitude, phase, and the polarization of the light can be modulated. The optics looking at the SLM does not resolve every mirror, so observable properties are the superposition of a small group of mirrors, e.g., the within the dashed circle in FIG. 7a. Special cases are modulation of only phase, only magnitude and only polarization. FIGS. 7b and 7c show how an arbitrary polarization can be created by controlling the magnitude of the Efield using tilting mirrors as shown in 3a. There is one incident polarization state, e.g., right-hand circular polarized light, to an array of mirrors. They have four different types of mirrors with surface patterns which create the reflected polarizations shown in the Poincaré sphere in FIG. 7c. Any polarization state can be synthesized by the superposition of the states $P_1$ to $P_4$ shown in the Poincaré sphere and selected such that the vectors span the Poincaré sphere using only positive magnitudes. The synthesis of arbitrary polarization states from partial beams will be clear to the person working with polarization, as well as alternative ways to express and arrange for the same result.

The array in FIG. 7a is intended to be generic in the sense that the mirrors may be tilting, pistonich or flipping on-off. The tilting case is the simplest, where the reflected intensity is under analog control, and the polarization state of that pixel can be continuously increased or decreased. It is also possible to control the polarization state in the piston mirror SLMs by having two or more mirrors creating destructive interference, thereby attenuating the polarization state produced by these mirrors. Finally, the polarizers may be applied to on-off mirrors like the TI DMD mirrors.

Figure 7D:
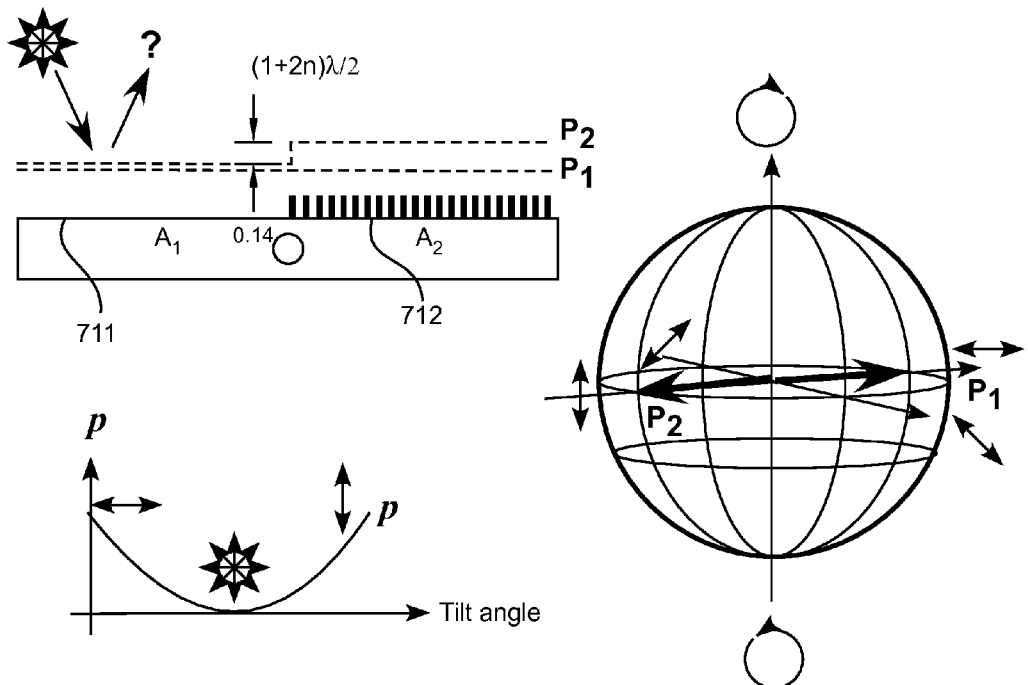
FIG. 7d shows a mirror which in an SLM acts as a controllable polarizing element.
Figure 7E:
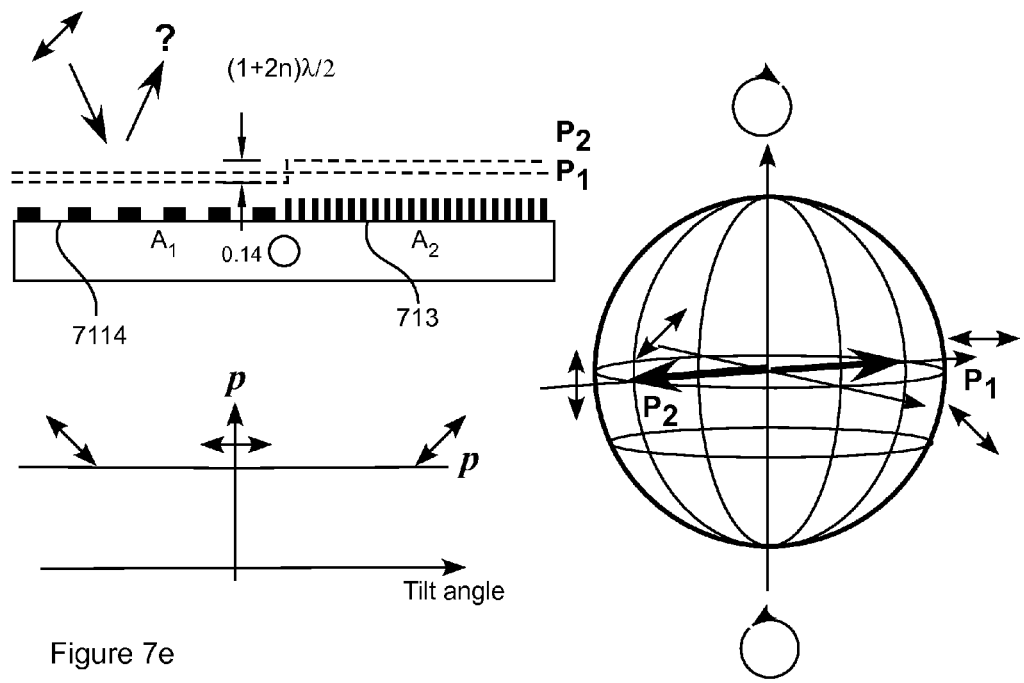
FIG. 7e shows a mirror which in an SLM can act as a controllable polarization-rotating element.

As reiterated a number of times, the described uses of surface patterns may be combined, as shown in FIGS. 7d and 7e. FIG. 7d shows a variable polarizer based on a flat tilting mirror for one polarization state $P_1$ and a phase-step mirror for a second state $P_2$. The SLM is illuminated with unpolarized light in FIG. 7d. The unpolarized light can be thought of as a combination of two complementary states, like $P_1$ and $P_2$. One state $P_1$ sees no phase difference between the two sides $A_1$ and $A_2$, while the other sees a 180 degree phase step. The phase step is created by a retarder plate on $A_2$, e.g., implemented by subwavelength lines of metal or dielectricum as described above. Therefore, state $P_1$ has maximum intensity when the tilt angle is zero and is increasingly attenuated when the tilt angle increases. $P_2$ has the exact opposite behaviors. Therefore, the modulator will work as a horizontal ($P_1$) polarizer when it is flat, be non-polarizing when it is half-way tilted and become a vertical ($P_2$) polarizer when it is more tilted. Design optimization can give a flat insertion loss versus tilt angle. The states $P_1$ and $P_2$ were chosen to be horizontal and vertical, but they can be chose arbitrarily with a different retarder design, e.g. with an elliptical retarder. Note that the Poincaré location for the output light lies on a straight line through the sphere. This is because the incident light is unpolarized and has two independent light waves with an unknown (and irrelevant) phase between them.

FIG. 7e shows nearly the same device, but used with polarized incident light. The difference is that the incident light is fully polarized and the output light will also be fully polarized, i.e., it is confined to the surface of the Poincaré sphere and the phase between component of the beam is relevant. The inset diagram also shows tilts to both sides where the phase-step changes the sign of $P_2$. The result is that the reflected state rotates from horizontal to vertical, anti-clockwise through all angles in-between when the mirror is tilted to the right. When it is tilted to the left it rotates between the same points but clockwise, thereby covering 360 degrees when the mirror tilts through its full range. There is a small difference between FIG. 7d and FIG. 7e: In 7e the phase difference between $P_1$ and $P_2$ is symmetric around the tilt axis, while in FIG. 7d it is not. (Therefore, the mirror in FIG. 7e is drawn with retarder microstructures on both sides.) This choice makes the two cases didactically simpler, but either mirror could have been used in either figure. The mirror of FIG. 7e would make the same result in FIG. 7d, and the mirror of FIG. 7d used in FIG. 7e would give an output polarization which went "over the north and south poles" of the Poincaré sphere.

As a practical matter, polarization-control microstructures typically have lateral dimensions comparable to half the wavelength of the light while the spase steps used for achromatisation, phase bias, etc. typically extend for several wavelengths laterally.

Applications of the Fully Complex SLMs Described Above.

Figure 8A:
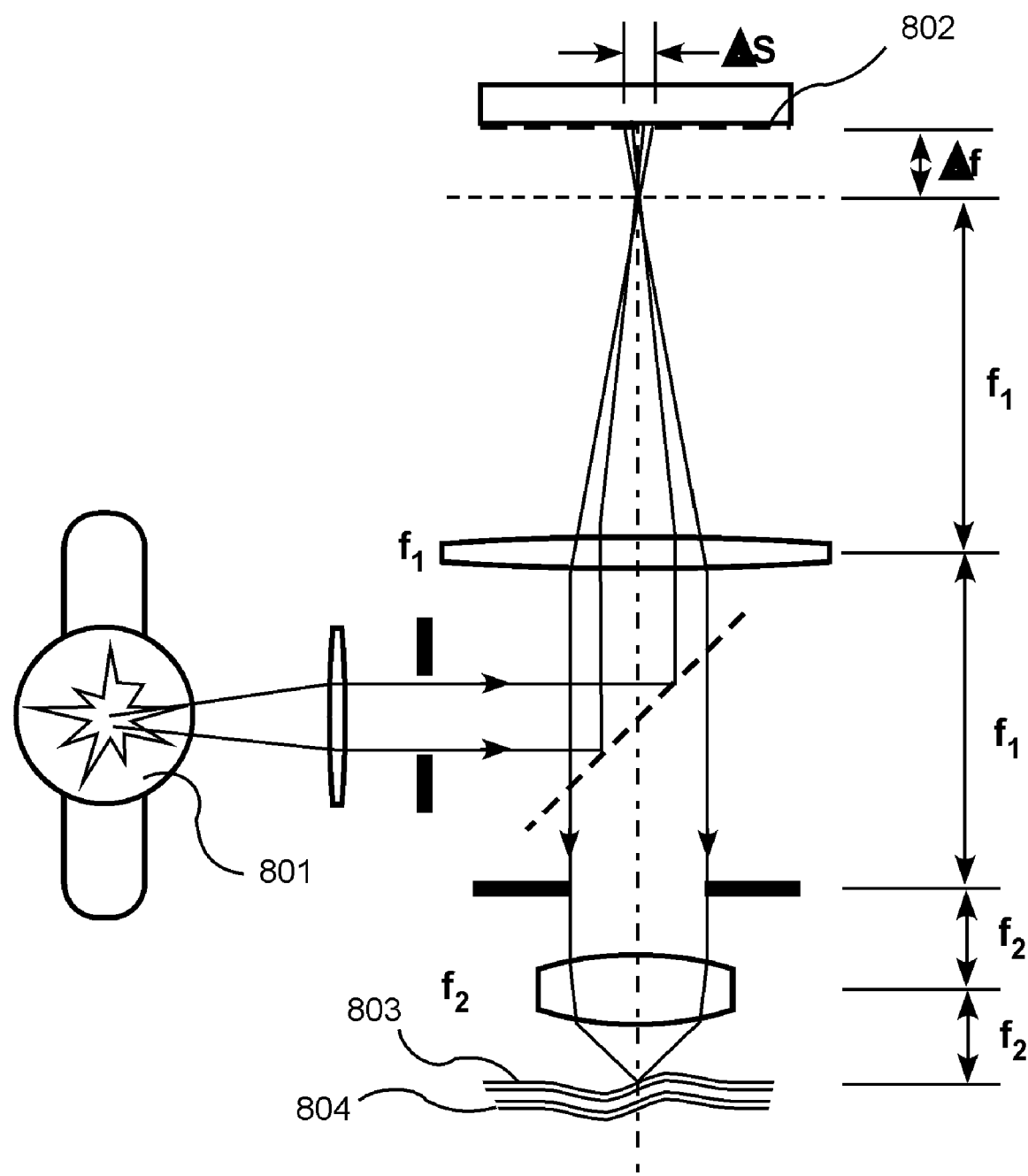
FIG. 8a shows a holographic lithographic printer using a fully complex SLM.

FIGS. 8, 9, and 10 show some applications of the fully complex and/or achromatized SLM described above. FIG. 8a shows a lithographic direct-writing system, e.g. for writing on wafers, masks, PCBs, etc., similar to systems described in literature (U.S. Pat. No. 7,009,753, included by reference) but with some important differences. Radiation from a light source 801 illuminates an SLM 802 and the reflected radiation is focused onto a workpiece 803 sensitive to the radiation, e.g. by photochemistry or heat. The light source with an emitted wavelength in the range 5 nm to 2000 nm may be continuous or pulsed, spectrally narrow or wide, and the stage may have a stop and go or continuous movement which builds up a contiguous image on the workpiece. The SLM is driven from a data path converting the input data which is to be written as a pattern on the workpiece to electronic signals with directly or indirectly drive the pixel elements of the SLM. What is new in FIG. 8a compared to prior art is that the SLM has fully complex modulation and that it is placed at an out-of-focus position Δf and that there is no one-to-one relation between a point on the SLM and a point on the workpiece. A point on the workpiece is controlled by a small area ΔS which is in fact a small hologram The fully complex SLM is acting as a hologram where a point on the workpiece is controlled by the collective modulation by a number of pixels. The out-of-focus distance can be small or large, but in any case larger than the Rayleigh length and preferably larger than four Rayleigh lengths, giving a small or large area which contribute to a point on the workpiece. One advantage of the scheme is that a calibration errors or defects in individual mirrors do not cause a localized large error in the written pattern, but rather a subtle loss of quality over some area since one point on the SLM contributes to an area on the workpiece. Moving the SLM further out of focus increases the averaging from many elements and reduces the risk for local errors in the image, but increases the needed dynamic range in the SLM, and the difficulty in calculating the data for the SLM. Furthermore a small area contributing to one point on the workpiece, e.g. 100, 1000, or 10000 pixels, makes the requirements for optical correction of the lenses easier than if a larger area was used, e.g. 100000 or 1000000 pixels.

One new property of the writer in FIG. 8a is that it has no fixed focus plane. Refocusing can be done by changing the data, and several foci may be produced in the same image, side by side or laterally superimposed. Therefore it may be used to write on non-flat workpieces 803. Another use is to write 3D patterns e.g. in a photocured polymer, The data to the SLM is calculated to give the desired 3D distribution of light in the polymer, most suitably by an iterative method. The writer can be used to write several depth layers with different patterns at once, e.g. for recordable multilayer data disks. Good isolation between layers and more free 3D design is easier to accomplish with a non-linear or threshold radiation-sensitive material, such as phase-change resists, binary metal resists, or by two or multi-photon exposure.

FIG. 8b shows how the image in a microscope or other projection instrument may be enhanced by the sue of an SLM as described above. The specimen or object is illuminated from a light source 806 by radiation in the range 5-2000 nm and imaged onto an image sensor, e.g. a CCD or CMOS sensor. In the aperture plane between the object 805 and sensor 807 is a fully complex SLM 805 which can be used for enhancement of the image. Examples of what can be done is high-pass and low-pass filtering, edge enhancement, phasecontrast imaging, despeckling, template matching, and correlation. The micromechanical SLM is stable, robust and long-lived, and with fully complex modulation it makes the image processing operations follow theory closely and add little noise and artifacts. The theory of image enhancement is well described in many textbooks on signal theory and image processing and is usually done completely in the digital domain. The difference to what is normally done by digital processing is that the image processing is applied after the image has been captured on the camera and the phase information has been lost. Here the processing is done by the photons on the way to the sensor and the phase is part of the result, giving more powerful analysis and visualization of subtle variations in the specimen. The method and device has been described by example from microscopy, but may also be applicable to lithography, metrology, and other areas using a projected image. A second use for the setup in FIG. 8b is aberration control, where wavefront errors, including focus, of the optical system can be corrected by phase on the SLM, giving always a perfect image. If the illumination is femtosecond pulses there is considerable broadening of the spectrum and the achromatization of SLMs described above may be of value.

FIG. 8c shows a similar system to FIG. 8b with a light source 810, an object 809, an image sensor 811, and an SLM as described above 812. The difference from FIG. 8b is that the SLM is placed in an image plane, where the SLM can be used for masking out light from bright areas in order to improve signal to noise in dark areas.

Figure 8D:
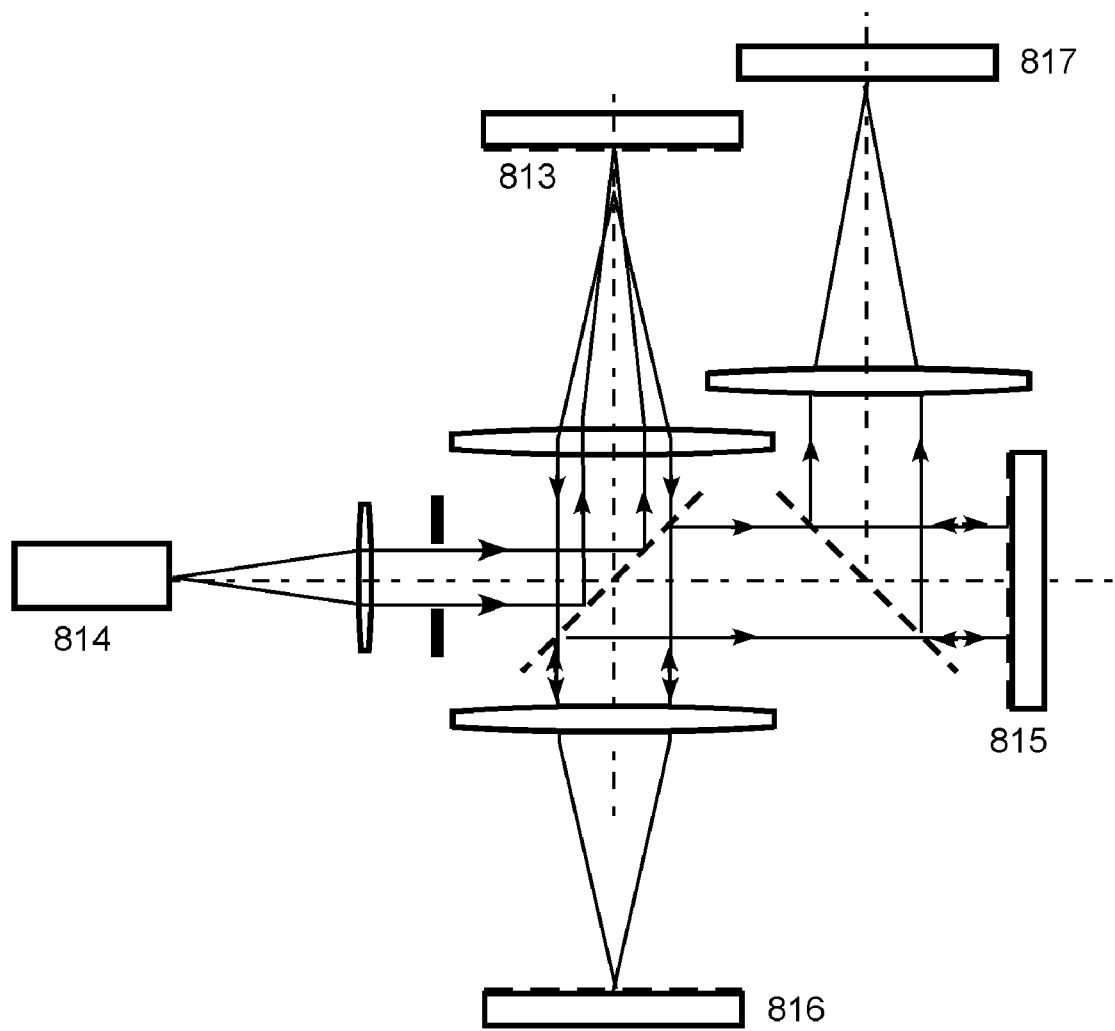

The two schemes in FIGS. 8b and 8c can be combined in the same instrument as shown in FIG. 8d. The object 813 is illuminated by a light source 814 which may be continuous or pulsed with pulse times down to attoseconds. The image is picked up on a sensor 817, or—like in FIGS. 8b and 8c, a human eye. The image is SLM filtered in an image plane 816, e.g., with a fully complex SLM, and in an aperture plane SLM 815 with a second SLM. Applications are microscopy, lithography, metrology and pattern inspection.

Figure 9A:
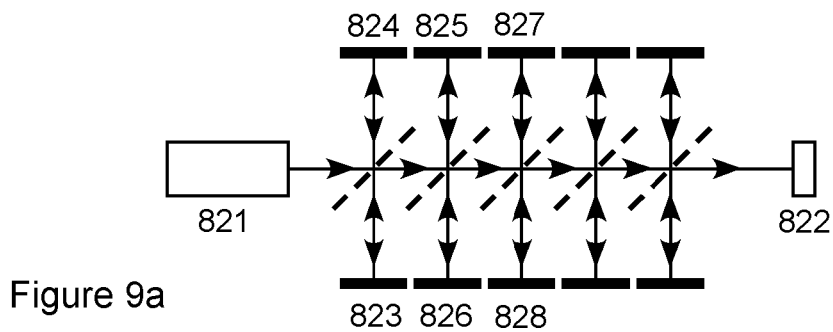
FIG. 9a-d show in schematic form image enhancement by means of SLMs according to the invention in ordinary, polarimetric, and interferometric microscopes.
Figure 9B:
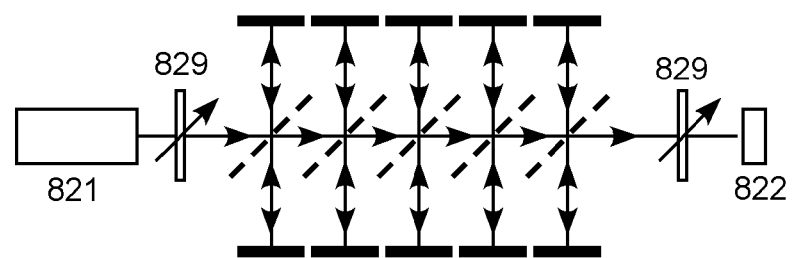
Figure 9C:
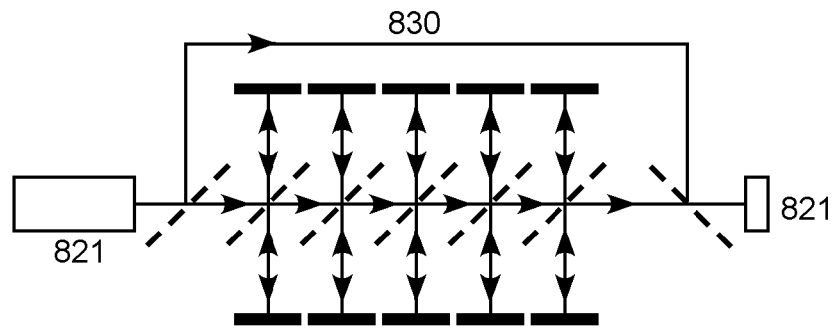
Figure 9D:
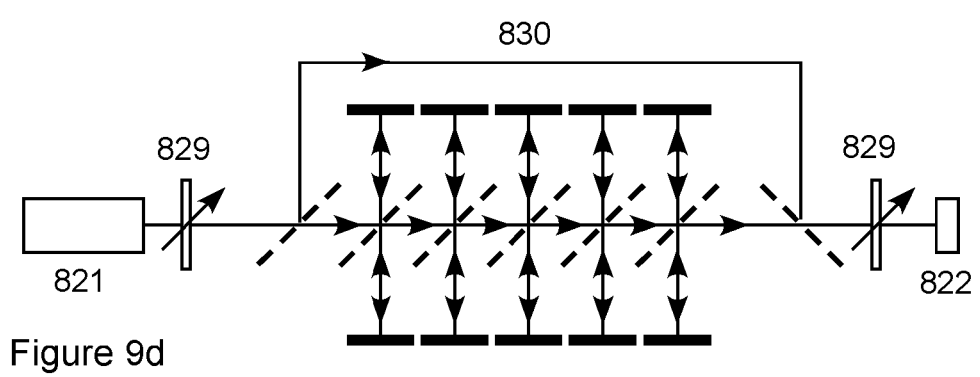
Figure 10A:
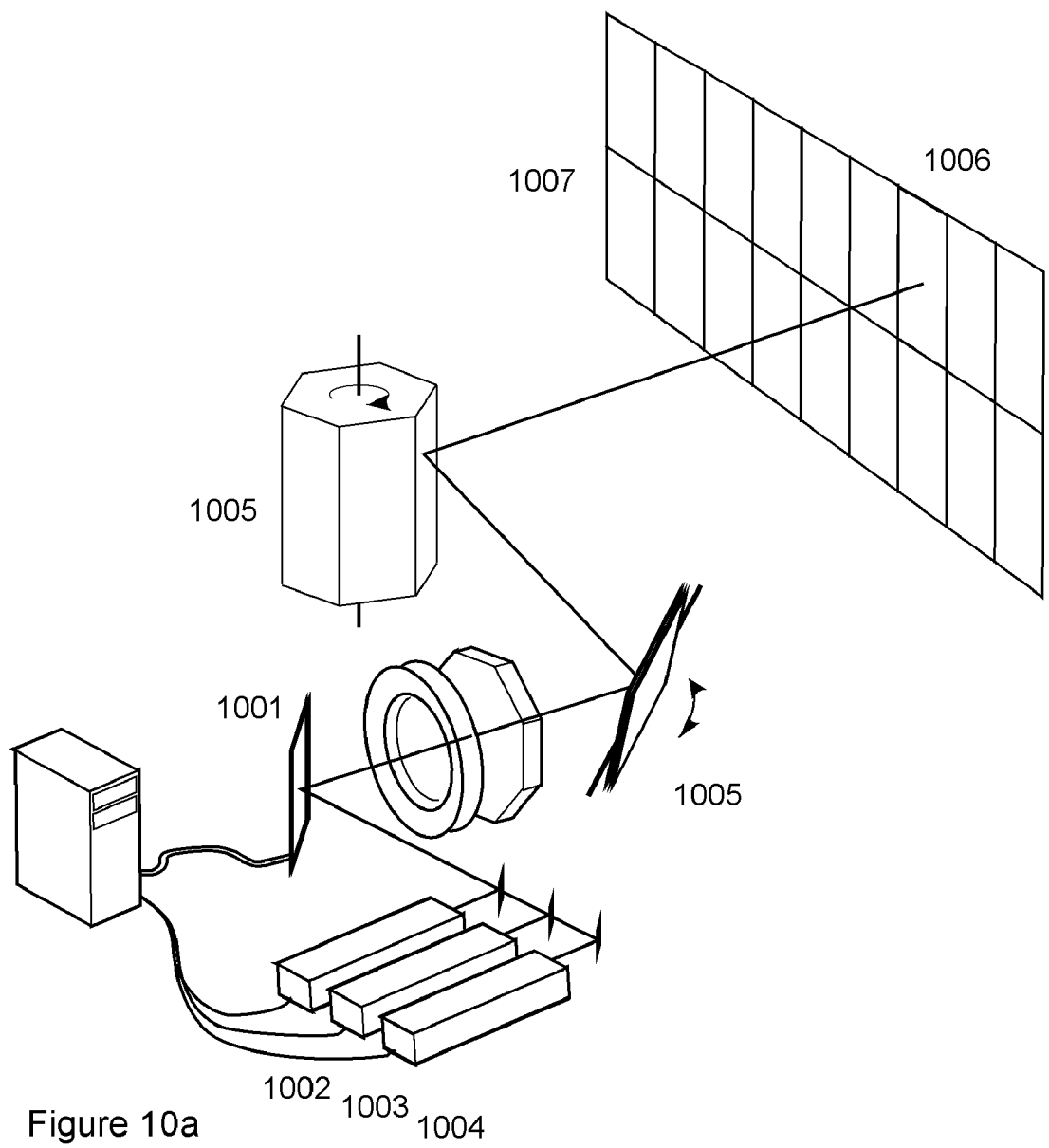
FIG. 10a shows a large-screen projector.

In FIGS. 8b-d the operation was exemplified by microscopy and similar projection where the object is a physical object, but the object can also be an SLM driven with images stored in a digital storage. The SLM image may represent optical and non-optical images, e.g. x-ray images, radar images, sonar echoes, astronomical density maps, spectra, diffraction patterns, population statistics etc, and they may be one- or two-dimensional. The advantage over digital-only processing may be the high processing capacity of an optical system, in principle instantaneous and limited only by the feeding of data to the object SLM and the readout from the sensor. The input bandwidth could be 10 or 100 Gbytes per second. FIG. 9a-d shows generalizations and developments of the scheme in FIGS. 8b-d. All figures have a light source and a detector (or equivalently an eye or a photosensitive surface). The light passes through a number of optical subsystems which convert it between the near-field and far-field or differently stated a number of image planes and aperture planes with optics in between. The aperture planes are on the top in the image 824, 825, 827, etc. The image planes are at the bottom 823, 236, 828, etc. Beamsplitters are indicated in the figures and the reader may imagine other optics which is not drawn. The first image plane is 823 and it may be a physical specimen or an SLM presenting a digital image, and 823 is illuminated by the light source 821 with the illumination shaped by the illumination aperture 824 (SLM or fixed aperture). There are a number of steps where the image is transformed between image and aperture planes and it may be filtered by SLMs or fixed filters at each step. This is a generalized architecture for certain types of image processing. In FIG. 9b variable polarisers 829 are added before and after the specimen for polarization analysis of the specimen. FIG. 9c a reference path 830 is added which gives a phase reference making the measurement interferometric or holographic. Finally, in FIG. 9d there is both a reference path and variable polarizers, allowing full polarized interferometry to be performed together with the filtering of the image.

FIG. 10 shows a large-screen projector making use of the extremely high data throughput which can be achieved with a MEMS array and the multicolor capability described above. The SLM 1001 is illuminated by three laser 1002, 1003, 1004 for the three color primaries. A scanning system 1005 builds up a large image 1007 from partial images 1006 of the SLM, e.g. 18000×8000 pixels from an SLM with 2000×4000 pixels.

Figure 10B:
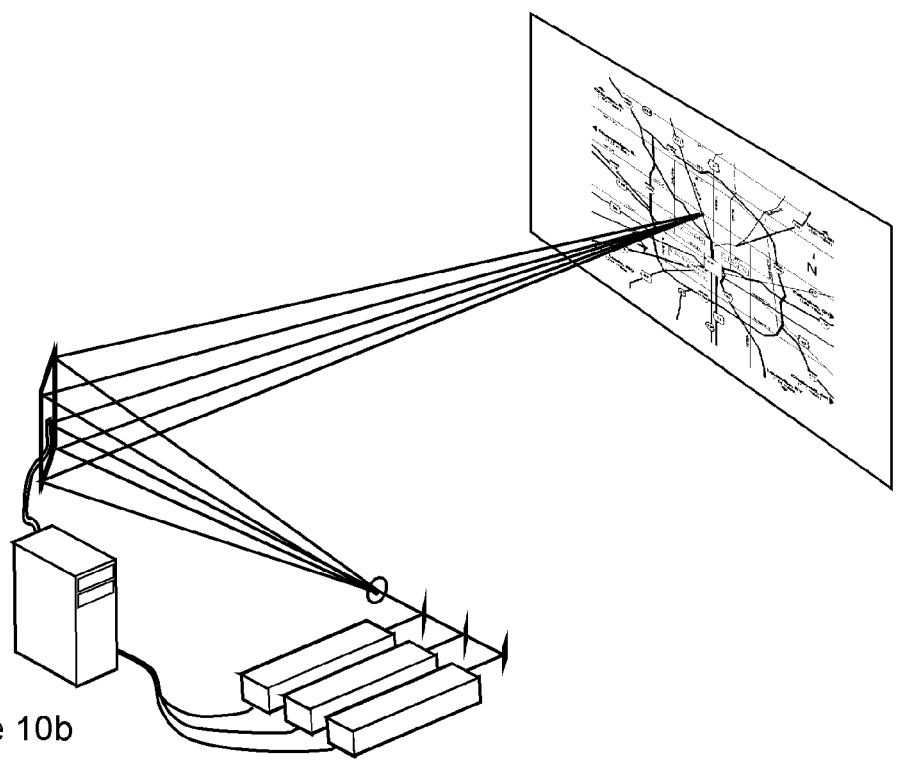
FIG. 10b shows how an image can be drawn by the device in beam-steering mode.

FIGS. 10b and c shows how a fully complex SLM can project an image without optics, since the convergence of the light to focus is encoded on the phase of the pixel data.

Figure 10C:
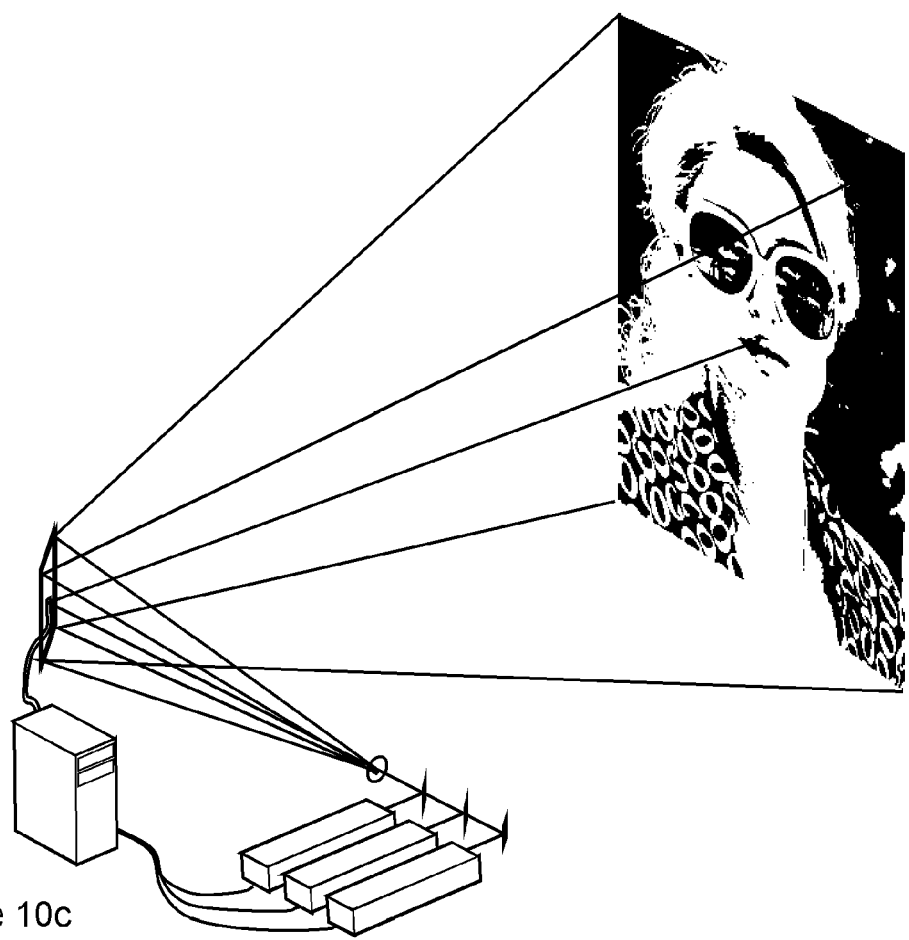
FIG. 10c shows how an image can be projected with no optics between the SLM and the screen.

FIG. 10b shows a line drawing application: a high-information content display, e.g. in a control room. The SLM shoots out a limited number of bright spots which trace the lines to be displayed. All the laser power goes to the illuminated lines and the image may fill a wall, still using only modelst laser power (the drawing shows dark lines on light background, while reality may be the opposite). FIG. 10c a lensless computer projector producing a normal pixilated halftone image. The difference between these two images are in the data and the holographic character of a fully complex SLM makes it possible to send all the light to a small subset of the image, making very large and bright line drawings possible. This different data it may show movies on a smaller area. All FIGS. 10a-c make use of broadband operation (three visible colours) possible through achromatization.

Micromechanical SLMs have high speed, high power handling capacity, and good stability. What this invention adds is flexibility to do different types of light modulation using the same basic platform, i.e. the same MEMS actuators and the same driving circuitry, including CMOS under the chip and data paths on and off the chip. Typically, the platform may be a CMOS circuit for fast matrix addressing of amicromechanical array of modulators, and the support electronics to feed the data and other signals to the SLM. By changing only the MEMS layer in a piston SLM, one can do phase modulation or fully complex modulation, for monochromatic light or for light with a wider spectrum. With another basic mirror architecture, the tilting mirror, either magnitude or fully complex modulation can be achieved, also for monochromatic light or light with an extended spectral range. Furthermore, the polarization may be modulated in SLMs with polarization modifying patterns or layers on the mirrors.

The SLMs described here are very powerful as image or information processing devices. Since they are coherent devices their typical fields of application are complementary to that of Texas Instruments' DMD devices. They can be used for optical image processing, adaptive optics, optimal filtering, incoherent to coherent image conversion, beam steering and shaping, wavefront correction, holography, projection, and lithography. SLMs with properties suitable for these applications may be different from application to application. It has been disclosed how SLM with a wide variety of properties may be created from the same mirror array on the same CMOS circuit by just changing the surface profile (and optionally surface films) of the mirrors. This is thought to be a valuable benefit of the invention, since it lowers the cost of adapting the technology to specific requirements and leverages investment in development and manufacturing capability.

A more thorough analysis will show that there is also a second-order effect: the mirror with 50%+180 and 50%−180 degrees will have an average reflectivity that is reduced by a quadratic function of the wavelength error. The next level of correction is to make the 0 degree mirror into 50% 0 degree, 25%+360 degrees, and 25%−360 degrees. In this way, gradually higher orders of achromatization can be added to the array, achromatization in the sense that good extinction for one wavelength is also good extinction for adjacent wavelengths.

The principle of the achromatization is that a phase difference of $\delta_0$ at $\lambda_0$ gives a derivative $d\delta/d\lambda = -\delta_0/\lambda_0$ and the equivalent (at $\lambda_0$) $\delta_0$-360 degrees gives the derivative $d\delta/d\lambda = (360-\delta_0)/\lambda_0$, if an area A with phase $\delta_0$ is divided into one part with phase $\delta_1 = \delta_0$ and area $A_1 = A*((360-\delta_0)/360)$ and one part with phase $\delta_2 = \delta_0 - 360$ and area $A_2 = A*(\delta_0/360)$.

This, and more complex cases, can be solved by looking at the derivatives $d(Re(E_{total}))/d\lambda$ and $d(Im(E_{total}))/d\lambda$, where $E_{total}$ is the integrated complex E field (as a phasor) over the area A and Re and Im denote the real and imaginary fields of it, and setting them equal to zero. More complete achromatization follows if also $d^n(Re(E_{total}))/d\lambda^n$ and $d^n(Im(E_{total}))/d\lambda^n$, where n is 2, 3 or larger, are set to zero or minimized over the wavelength span.

Some Particular Embodiments

The present invention may be practiced as a device that modulates coherent or partially coherent illumination or as a method of modulating the coherent or partially coherent illumination. It also may be practiced as a method of manufacturing such a device. One embodiment is a spatial light modulator with a plurality of off axis step surface mirrors. The SLM is adapted to relay coherent or partially coherent illumination with predetermined resulting wave characteristics of the related illumination. The device includes an array of tilting mirrors, each mirror having at least one essentially flat reflecting surface and the tilted axis for the mirror. It includes a surface structure over the essentially flat reflecting surface of at least some mirrors among the array of tilting mirrors. Different surface structures may be present on different mirrors. Not all of the near mirrors need to have the surface structure. The surface structure of the mirrors in this embodiment has a least one step that divides the reflecting surface into a plurality of smaller reflecting surfaces. The step creates a phase difference between parts of the related illumination that is reflected from a plurality of smaller reflecting surfaces. At least one step on a mirror is off access, relative to the tilted axis. In some embodiments, the step is essentially perpendicular to the tilted axis.

One aspect of the first device embodiment includes surface structured mirrors having off access steps effected to compensate for variation in the wavelength of the illumination. The variation in wavelength of the illumination may result in varying wave characteristics. As described above, this compensation may allow a mirror array to work with varying wavelengths of light.

Another aspect of the first device embodiment applies to illumination having a center wavelength. According to this aspect the phase difference between parts of the related illumination from the plurality of reflecting surfaces is larger than 270 degrees relative to the center wavelength. That is, a phase difference of at least three quarters of a wavelength. The related aspect also has a center wavelength and has a phase difference between parts of the related illumination from the plurality of reflecting services being approximately n*360 degrees relative to the center wavelength, where n is a positive, nonzero integer.

In any of the foregoing aspects, the device may further exhibit the characteristic that the calculated derivatives of phase of the relayed illumination have opposite signs on different sides of the step.

To any of the foregoing aspects, surface microstructures may be added to the mirrors effective part to produce a predetermined polarization state of the related illumination. A surface microstructure may be partially reflecting surfaces formed with lateral dimensions being smaller than half a wavelength in regular grids, such as one-dimensional grids. These microstructures and reflect to different instant polarizations with different phases. They also may reflect to different instant polarizations with different magnitudes. Or they may reflect to different instant polarizations with the phase difference, the phase difference being different on opposing sides of the tilted axis.

The surface structured mirrors in the foregoing aspects embodiments may have off-axis steps effected to produce a predetermined trajectory of intensity and phase in the related illumination through a range of mirror tilts, the predetermined trajectory being different from trajectories produced by mirrors without off-axis steps.

A second device embodiment is a spatial light modulator with a plurality of phase offset pixel groups, adapted to relay coherent or partially coherent illumination with fully complex intensity and phase modulation of the relayed illumination from the pixel groups. This device includes an array of tilting mirrors, the mirrors having at least one essentially flat reflecting surface and the tilted axis. The device includes groups of mirrors among the array of tilting mayors. Individual mirrors in the groups are arranged to have differing heights, producing a phase offsets among the individual mirrors in the groups. Driving the individual mirrors in the groups produces a fully complex intensity and phase modulation of the relayed illumination from the groups.

One aspect of this embodiment is at least two mirrors in a group have a phase step of $(1+2n)*\lambda/4$ (n being a non-negative integer). And, the two mirrors have different phase offsets relative to an axis of illumination. This aspect combines one or more steps in an individual mirror with different offsets between mirrors.

This device embodiment may be combined with any of the aspects of the first device embodiment. Various combinations of features from the different aspects may be combined to produce a wide variety of feature combinations.

Practicing this embodiment and its aspects may produce illumination areas having any complex reflection constant with the unit circle that represents real and complex parts of the resulting illumination. This fully complex modulation of intensity and phase may be produced with minimal tilt of the mirrors, amounting to one quarter wavelength or less at the edge of the mirrors.

A further device embodiment is a spatial light modulator with a plurality of deep-stepped mirrors, adapted to relay coherent or partially coherent illumination with reduced operational sensitivity to illumination wavelength. This device includes an array of tilting mirrors, the mirrors having at least one essentially flat reflecting surface axis. The array includes at least some deep stepped mirrors having at least one step that divides the reflecting surface into a plurality of reflecting surfaces. By deep stepped we mean a step that creates a height difference of more than 135 degrees relative to the center wavelength of the illumination. This height differences between adjacent reflecting surface on a particular mirror reduces the dependence of diffraction effects during mirror operation on the illumination wavelength. As described above, the deep stepped mirrors may accommodate different illumination sources, such as laser sources having 355 nanometer or 405 nanometer wavelengths, without redesigning or replacing the spatial light modulator.

This further device embodiment may be combined with any of the aspects of the first or second device embodiment. Various combinations of features from the different aspects may be combined to produce a wide variety of feature combinations.

Yet another device embodiment is a spatial light modulator with a plurality of polarization modifying microstructures applied to pixel groups, adapted to relay coherent or partially coherent elimination. In some embodiments, this device provides fully complex intensity and phase modulation of the relayed illumination from the pixel groups. This spatial modulator includes an array of tilting mayors, the mirrors having at least one essentially flat reflecting surface and a tilt axis. The array includes groups of tilting mirrors. Individual mirrors in the groups are arranged to have differing polarization producing microstructures on the surfaces of individual mirrors. The array is adapted for driving the individual mirrors and groups to produce a controllable polarization state of the relayed illumination from the groups. One who has reviewed this whole disclosure will understand that an optical system which does not resolve individual mirrors results in relayed illumination that averages or represents characteristics of illumination relied from a group of adjacent mirrors.

One aspect of this fourth embodiment includes steps dividing at least one essentially flat reflecting surface into partial surfaces with different heights. The different heights are chosen to reduce the influence on intensity and phase of the relayed illumination of variations in wavelength of the illumination.

The four preceding embodiments in this section regarding particular embodiments can be bridged and commonly characterized by the following device. The bridging device is a spatial light modulator with a plurality of mirrors, adapted to modify phase and/or polarization and to relay coherent or partially coherent illumination. This bridging device includes a mirror array of tilting mirrors that control intensity of the relayed illumination by diffraction effects. The mirrors have at least one essentially flat reflecting surface and a tilt axis. This spatial light modulator embodiment further includes individual mirrors or groups of mirrors that have a difference in surface structure among areas on an individual mirrors were among mirrors in the groups of mirrors. By differences in surface structure we mean a difference in height among areas of a mirror or between mirrors and/or a surface microstructure. One example of a surface microstructure is described in the context of polarizing microstructures in the foregoing disclosure. In this bridging embodiment, the mirrors with the difference in surface structure adapted to be driven individually or in groups to produce a combination of intensity and of (phase and/or polarization) that cannot be achieved by either an array of tilting mirrors that have a single flat reflecting surface or an array of tilting mirrors that have a stepped reflecting surface with the step coincident with the tilt axis. This bridging embodiment is intended to provide a single independent claim from which claims to the first four device embodiments may be written in dependent form.

Each of the foregoing device embodiments may be expressed as a method, substantially in the form of using a micro mirror array having a certain structure to modify coherent or partially coherent illumination and produce relayed illumination having the characteristics associated with the respective device embodiments. The actions of such methods may include illuminating a micro mirror array, reflecting the illumination from structures of the micro mirror array having certain features, and relaying the modified illumination to produce certain characteristics, as described above.

A method embodiment can be used to manufacture some or all of the device embodiments described above uses nano printing on mirrors in an array of micro-mirrors. This method includes nano imprinting of a UV-hardening compound on a polymer film with a depth pattern from a template. The method proceeds with hardening the UV-hardening compound and depositing a reflecting film over the hardened compound. It further includes processing the reflecting film to form an array of tilting micro-mirrors.

I claim as follows:

1. A spatial light modulator (an SLM) with a plurality of off-axis stepped surface mirrors, adapted to relay coherent or partially coherent illumination with predetermined resulting wave characteristics of the relayed illumination, including:
    an array of tilting mirrors, each mirror having at least one essentially flat reflecting surface and a tilt axis;
    surface-structure over the essentially flat reflecting surface of at least some mirrors among the array of tilting mirrors, the surface-structured mirrors having at least one step that divides the reflecting surface into a plurality of reflecting surfaces and creates a phase difference between parts of the relayed illumination from the plurality of reflecting surfaces;
    wherein the at least one step is off-axis, relative to the tilt axis.

2. The SLM of claim 1, further including:
    the surface-structured mirrors having off-axis steps effective to compensate for variation in wavelength of the illumination, resulting in varying wave characteristics.

3. The SLM of either claim 1 or 2, further including:
    the relayed illumination having a center wavelength; and
    the phase difference between parts of the relayed illumination from the plurality of reflecting surfaces being larger than 270 degrees relative to the center wavelength.

4. The SLM of either claim 1 or 2, further including:
    the relayed illumination having a center wavelength; and
    the phase difference between the parts of the relayed illumination being approximately n*360 degrees relative to the center wavelength, where n is a positive, non-zero.

5. The SLM of either claim 1 or 2, wherein:
    calculated derivatives of phase of the relayed illumination having opposite signs on different sides of the step.

6. The SLM of claim 1, further including:
    the surface-structured mirrors having off-axis steps effective to produce a predetermined polarization state of the relayed illumination.

7. The SLM of any of claim 1 or 6 further including:
    the surface structured mirrors having at least one partial reflecting surface formed from micro structures with a lateral dimension being smaller than half a wavelength in regular one-dimensional grids.

8. The SLM of any of claim 1 or 6, further including:
    having microstructures that reflect two different incident polarizations with different phases.

9. The SLM of any of claim 1 or 6, further including:
    having microstructures that reflect two different incident polarizations with different magnitudes.

10. The SLM of any of claim 1 or 6, further including:
    reflecting two different incident polarisations with a phase difference, said phase difference being different on two sides of the tilt axis.

11. The SLM of claim 1, further including:
the surface-structured mirrors having off-axis steps effective to produce a predetermined trajectory of intensity and phase in the relayed illumination through a range of mirror tilts, the predetermined trajectory being different from trajectories produced by mirrors without off-axis steps.

12. A spatial light modulator (an SLM) with a plurality of phase offset pixel groups, adapted to relay coherent or partially coherent illumination with fully complex intensity and phase modulation of the relayed illumination from the pixel groups, including:
an array of tilting mirrors, the mirrors having at least one essentially flat reflecting surface and a tilt axis;
groups of mirrors among the array of tilting mirrors, individual mirrors in the groups arranged to have differing heights producing phase offsets among the individual mirrors in the groups;
wherein driving the individual mirrors in the groups of mirrors produces a fully complex intensity and phase modulation of the relayed illumination from the groups.

13. The SLM of claim 12, further including:
at least two mirrors in a group having a phase step of (1+2n)*lambda/4 (n being a non-negative integer), the two mirrors having different phase offsets relative to an axis of the illumination.

14. The SLM of claim 13, further including:
producing any complex reflection constant within a unit circle while limiting travel to values smaller or equal to a quarter of the wavelength at the edge of the mirrors.

15. A spatial light modulator (an SLM) with a plurality of deep-stepped mirrors, adapted to relay coherent or partially coherent illumination with reduced operational sensitivity to illumination wavelength, including:
an array of tilting mirrors, the mirrors having at least one essentially flat reflecting surface and a tilt axis;
deep-stepped mirrors among the array of tilting mirrors, the deep-stepped mirrors having at least one step that divides the reflecting surface into a plurality of reflecting surfaces and creates a height difference more than 135 degrees, relative to a center wavelength of the illumination, between adjacent reflecting surfaces on a particular mirror;
whereby dependence of diffraction effects resulting from mirror operation on illumination wavelength is reduced.

16. A spatial light modulator (SLM) with a plurality of polarization-modifying microstructures applied to pixel groups, adapted to relay coherent or partially coherent illumination with fully complex intensity and phase modulation of the relayed illumination from the pixel groups, including:
an array of tilting mirrors, the mirrors having at least one essentially flat reflecting surface and a tilt axis;
groups of mirrors among the array of tilting mirrors, individual mirrors in the groups arranged to have differing polarization-producing microstructures on surfaces of the individual mirrors among the individual mirrors in the groups;
wherein driving the individual mirrors in the groups of mirrors produces a controllable polarization state of the relayed illumination from the groups.

17. The SLM of claim 16, further including:
Steps dividing at least one essentially flat reflecting surface into partial surfaces with different heights chosen to reduce the influence on the intensity and phase of the relayed radiation by the incident wavelength.

18. A spatial light modulator (an SLM) with a plurality of mirrors, adapted to modify phase and/or polarization of and to relay coherent or partially coherent illumination, including:
a mirror array of tilting mirrors that control intensity of the relayed illumination by diffraction effects, the mirrors having at least one essentially flat reflecting surface and a tilt axis; and
individual mirrors or groups of mirrors having a predetermined difference in surface structure among areas on the individual mirrors or among mirrors in the groups of mirrors, wherein the difference in surface structure is a difference in height and/or surface microstructure;
wherein the mirrors with the predetermined difference in surface structure are adapted to be driven individually or in groups to produce a combination of intensity and of phase and/or polarization that cannot be achieved by either an array of tilting mirrors that have a single flat reflecting surface or by an array of tilting mirrors that have a stepped reflecting surface with a step coincident with the tilt axis.

* * * * *